(12) United States Patent
Baroni et al.

(10) Patent No.: US 9,184,552 B2
(45) Date of Patent: Nov. 10, 2015

(54) METHOD AND APPARATUS FOR REDUCING THE AMPLITUDE MODULATION OF OPTICAL SIGNALS IN EXTERNAL CAVITY LASERS

(71) Applicant: Google Inc., Mountain View, CA (US)

(72) Inventors: Paolo Baroni, Gattinara (IT); De Donno Marco, Milan (IT); Anna Ronchi, Milan (IT)

(73) Assignee: Google Inc., Mountain View, CA (US)

( * ) Notice: Subject to any disclaimer, the term of this patent is extended or adjusted under 35 U.S.C. 154(b) by 82 days.

(21) Appl. No.: 13/950,626

(22) Filed: Jul. 25, 2013

(65) Prior Publication Data
US 2013/0308664 A1 Nov. 21, 2013

Related U.S. Application Data

(62) Division of application No. 12/936,723, filed as application No. PCT/IT2008/000240 on Apr. 11, 2008, now Pat. No. 8,520,709.

(51) Int. Cl.
H01S 3/10 (2006.01)
H01S 5/14 (2006.01)
(Continued)

(52) U.S. Cl.
CPC .......... *H01S 3/10038* (2013.01); *H01S 5/062* (2013.01); *H01S 5/10* (2013.01); *H01S 5/141* (2013.01); *H01S 3/1055* (2013.01); *H01S 5/02216* (2013.01); *H01S 5/02248* (2013.01); *H01S 5/02284* (2013.01);
(Continued)

(58) Field of Classification Search
CPC .................. H01S 3/10038; H01S 5/06832
See application file for complete search history.

(56) References Cited

U.S. PATENT DOCUMENTS 3,453,557 A * 7/1969 Polanyi et al. ................ 372/32
3,543,181 A * 11/1970 Lee et al. ...................... 372/32
(Continued)

FOREIGN PATENT DOCUMENTS

EP 1850431 A1 10/2007
JP 2007234916 A 9/2007
(Continued)

OTHER PUBLICATIONS

International Search Report for Application No. PCT/IT2008/000240 dated Dec. 16, 2008.
(Continued)

*Primary Examiner* — Joshua King
(74) *Attorney, Agent, or Firm* — Honigman Miller Schwartz and Cohn LLP

(57) ABSTRACT

A laser apparatus includes an external cavity laser (ECL) where the optical signal is modulated by an electrical modulation signal for modulating in frequency the laser output signal. The modulation in frequency produces a modulation of intensity (power) of the laser output signal, also denoted amplitude modulation (AM). A method of controlling the AM amplitude of a signal emitted by an ECL includes a gain medium, a phase element with variable transmissivity induced by the modulation, and a spectrally selective optical filter that selects and keeps the AM amplitude below a certain desired value or minimizes such value. A control method and a laser apparatus are also described in which the reduction of the AM component of the output power is achieved by acting on the gain of the gain medium of the ECL.

15 Claims, 15 Drawing Sheets

(51) Int. Cl.
  *H01S 3/1055* (2006.01)
  *H01S 5/022* (2006.01)
  *H01S 5/024* (2006.01)
  *H01S 5/062* (2006.01)
  *H01S 5/0625* (2006.01)
  *H01S 5/065* (2006.01)
  *H01S 5/0683* (2006.01)
  *H01S 5/10* (2006.01)

(52) U.S. Cl.
  CPC ........ *H01S 5/02415* (2013.01); *H01S 5/02476* (2013.01); *H01S 5/02492* (2013.01); *H01S 5/0653* (2013.01); *H01S 5/0683* (2013.01); *H01S 5/06213* (2013.01); *H01S 5/06246* (2013.01); *H01S 5/06251* (2013.01); *H01S 5/101* (2013.01)

(56) References Cited

U.S. PATENT DOCUMENTS

| | | | |
|---|---|---|---|
| 5,007,062 A * | 4/1991 | Chesnoy | 372/26 |
| 5,828,477 A * | 10/1998 | Nilsson et al. | 398/185 |
| 6,661,814 B1 * | 12/2003 | Chapman et al. | 372/6 |
| 6,661,815 B1 * | 12/2003 | Kozlovsky et al. | 372/20 |
| 6,665,321 B1 | 12/2003 | Sochava et al. | |
| 6,813,448 B1 | 11/2004 | Chiappetta | |
| 7,209,498 B1 | 4/2007 | Chapman et al. | |
| 2003/0026302 A1 * | 2/2003 | Anthon et al. | 372/29.01 |
| 2005/0213618 A1 * | 9/2005 | Sochava et al. | 372/20 |
| 2006/0140228 A1 | 6/2006 | McDonald et al. | |
| 2007/0002924 A1 | 1/2007 | Hutchinson et al. | |
| 2007/0133647 A1 | 6/2007 | Daiber | |
| 2008/0025349 A1 | 1/2008 | Mizutani et al. | |

FOREIGN PATENT DOCUMENTS

| | | | |
|---|---|---|---|
| WO | WO-2005041372 A1 | 5/2005 | |
| WO | WO-2005064365 A1 | 7/2005 | |
| WO | WO-2006002663 A1 | 1/2006 | |

OTHER PUBLICATIONS

Sato et al., "A Compact External Cavity Wavelength Tunable Laser Without an Intracavity Etalon", IEEE Photonics Technology Letters, vol. 18, No. 10, May 2006, pp. 1191-1193.
Office Action for U.S. Appl. No. 12/936,723 Dated Apr. 9, 2013.

* cited by examiner

METHOD AND APPARATUS FOR REDUCING THE AMPLITUDE MODULATION OF OPTICAL SIGNALS IN EXTERNAL CAVITY LASERS

CROSS REFERENCE TO RELATED APPLICATIONS

This U.S. patent application is a divisional of, and claims priority under 35 U.S.C. §121 from, U.S. patent application Ser. No. 12/936,723, filed on Apr. 11, 2008, which claims priority under 35 U.S.C. §371 to PCT Application PCT/IT2008/000240, filed on Apr. 11, 2008. The disclosures of these prior applications are considered part of the disclosure of this application and are hereby incorporated by reference in their entireties.

TECHNICAL FIELD

This disclosure relates to fiber optical communication systems and concerns the transmission of optical signals generated by a transmitter that includes an external cavity laser in which the effects of stimulated Brillouin scattering are reduced or suppressed.

BACKGROUND

In fiber optical telecommunication systems, a problem that can rise when an optical signal generated by a laser optical source is transmitted along a fiber is the Stimulated Brillouin Scattering (SBS). The stimulated Brillouin scattering is a known inelastic process of interaction between acoustic and optical waves that propagate in the fiber, made possible by nonlinear effects of the transmissive medium. The thermally excited acoustic waves (phonons) produce a periodic modulation of the index of refraction due to electrostriction. The SBS causes the back-reflection of part of the light that propagates inside the fiber and a contemporary reduction of its frequency (Brillouin shift). The decrease of the light frequency is of the order of 10-20 GHz for silica fibers.

The stimulated Brillouin scattering, as a matter of fact, limits the maximum optical power that can be exploited to transmit signals, since when a certain threshold (hereinafter also referred to as SBS threshold) of optical power is exceeded, the greatest part of the optical power above the threshold is reflected back towards the transmission apparatus. The portion of reflected light, in addition to reducing the power transmitted in the fiber, returns to the transmitter degrading the optical system performances.

Different characteristics of the optical system define the SBS power threshold, such as the wavelength of the signal and the characteristics of the transmission optical fiber employed, for instance its effective area value, the material and the doping profile thereof.

Typically, the laser sources for telecommunications do not emit a monochrome radiation, in the sense that the signal emitted by a non-modulated laser has a finite line width. Additionally, the modulation operated on the optical carrier with the purpose of conveying the useful signal in the transmissive tends to further widen the line width of the emitted power (generally defined as optical power per unit of frequency or optical wavelength). Typical values of line width of the output signal of an external cavity laser for optical systems are comprised between 10 and 100 MHz.

A method to reduce the SBS requires the artificial increase of the power spectral density of a transmitting laser and therefore of the spectral emission width so as to reduce the levels of average optical power for unit frequency.

Recently the interest in having tunable optical laser sources has increased, especially to be used as transmitters in wavelength division multiplexing (shortened, WDM) systems and high channels density WDM systems, the DWDMs (dense wavelengths division multiplexing), in which a plurality of separate data flows are simultaneously transmitted in a single optical fiber and every channel is generated by modulating light of suitable frequency or wavelength emitted by a laser. Additionally, the tunable lasers can be for instance used in virtual private networks based on wavelength addressing.

A technological solution widely used with the purpose of achieving its operation on single longitudinal mode and to guarantee the spectral purity and frequency stability required by most of the applications, is that of the configuration external cavity that offers a good flexibility, because the optimization of the laser parameters can be entrusted to a suitable choice of the typology, of the number and of the related specifications of the different optical elements that can be inserted in the laser cavity. Moreover, high output powers are generally easily obtainable.

The selection of the wavelength or frequency of the output signal from an External Cavity Laser (ECL) is generally accomplished using a tunable filter by means of various mechanisms, like for instance a thermo-optical, electro-optical or piezo-electrical mechanism.

SUMMARY

The Applicant has observed that transmitter configurations that include electronic and/or optical devices connected to the laser for the suppression of the stimulated Brillouin scattering increase the apparatus costs and are therefore anti-economic.

Recently, in the market of the optical communication systems, there is the need to have available transmitters that emit relatively high output powers, for instance higher than 10-15 dBm. Since the SBS effect is linked to the optical power introduced in the fiber of the optical system, given a certain threshold power defined by the parameters of the fiber and the system, the need to increase the output power of the laser can lead to the necessity of increasing the spectral width of the signal emitted by the transmitter. By way of example, to an SBS power threshold of around 19 dBm for an optical signal transmitted along a single-mode SMF optical fiber can correspond a widening of the spectral width of the output signal of the transmitter of around 1.0-1.2 GHz.

A widening of the spectral width of the output signal of the laser can be achieved, for instance, by applying a frequency modulated signal (dither) to the supply current of the laser gain medium. Alternatively, it is possible to apply a dither to the current that supplies a phase optical element present in the cavity. The phase element varies its optical length (or optical phase) in response to changes in a control parameter, like the applied voltage, the temperature or micro-mechanical movements induced by MEMS or piezo-electric actuators.

The dither frequency is generally selected so as to be different from the frequencies used for transmitting the date signal, to avoid signal overlaps. The dither frequency can for instance be included between 1 and 300 kHz. The frequency could additionally be selected so as not to cause interferences with the frequencies used for transmissions in the service channels devoted to the signaling.

The dither signal causes a correspondent modulation of the length of the optical path of the external cavity of the laser. This produces an effect of variation of modulated phase that results in a frequency modulation of the emitted optical signal. The frequency modulation produces in turn a modulation of intensity (power) of the laser output signal, also said amplitude modulation (AM), as referred to in the following, caused by the variation of loop gain inside the laser cavity. The generated amplitude modulation is superimposed to the laser signal in output producing a modulation of the power of the signal itself.

The Applicant has observed that this oscillation in intensity of the output optical power can lead to a worsening of the performances of the optical system since it is superimposed to the data signals and/or the signaling signals, jeopardizing a correct reception of them.

The resultant amplitude modulation in the case of direct modulation of the gain (or injection) current of a semiconductor gain medium of the laser can be particularly remarkable, since, varying the current that passes through the gain medium, the gain itself, and thus the output power, experiences a variation.

More in detail, in case the gain medium is a semiconductor laser diode, the output power, $P_{OUT}$, is proportional to the gain (or injection) current, $I_G$, according to the relationship:

$$P_{OUT} = (I_G - I_{th}) \cdot \frac{\eta_i h\nu}{e} \cdot \left( \frac{-\ln(R)}{\alpha L - \ln(R)} \right) \quad (1)$$

where $I_{th}$ is the threshold current of the laser diode, $\eta_i$ is the inner quantum efficiency of the laser diode cavity, h is the Planck constant, v is the optical frequency, e is the electron charge, R is the reflectivity of the mirrors at the ends of the laser cavity, $\alpha$ is the transmissivity of the external cavity and L is the optical length of the laser cavity. From the relationship (1) it can be derived that to a variation of gain current $(I_G - I_{th})$ proportionally corresponds a variation of output power $P_{OUT}$.

The line width of the optical signal is in relationship with the modulation depth of the applied dither signal: to an increase of the modulation depth an increase of the line width corresponds. The Applicant has observed that a typical relationship between spectral widening and amplitude of the applied dither modulation is 200-300 MHz/mA.

The Applicant has considered that the AM modulation generated by the frequency modulation applied to an infra-cavity phase element different from the gain element is significantly lower than the AM modulation that would be generated in the case of direct modulation of the gain current. Nevertheless, the Applicant has observed that also in the case of dither signal applied to a phase element, a "residual" AM modulation exists in the output signal that can be unacceptable, and therefore not acceptable for applications in WDMs optical systems in which transmitter powers higher than about 13-15 dBm and the suppression or the reduction of the SBS are required.

The present disclosure provides, inter alia, a method to reduce the amplitude modulation in the output optical signal of an external cavity laser that exhibits a widening of the spectral line generated by a modulation of the optical length of the cavity and/or to reduce or suppress the SBS effect in the output signal of an external cavity laser.

In one aspect, the ECL is a tunable laser. In a tunable external cavity laser, the wavelength (or frequency) of the output signal can be selected inside an operational wavelengths range that, for applications in WDMs and DWDM optical systems, correspond to the optical frequencies of the transmission channels defined by the standard ITU (International Telecommunication Union). The wavelength is selected by the channel selector, generally a tunable optical filter that exhibits a transmission or reflection spectrum having a peak corresponding to the selected wavelength.

The grid of the ITU channels is often provided by a grid generator optical filter, for instance a Fabry-Perot (FP) filter also said etalon, that selects the longitudinal periodic modes of the cavity at intervals that correspond to the spacing between the channels and rejects the neighboring modes. When present in a cavity laser together with a grid generator, the channel selector operates as a coarse tunable element that discriminates among the transmission peaks of the grid generator filter. In some implementations, the width of the optical band of the tunable filter, represented for instance by the full width at half-maximum (FWHM), is higher than the bandwidth of the transmission peaks of the grid generator filter. For a single mode laser emission, a cavity longitudinal mode is positioned on the maximum of one of the transmission peaks of the grid (the one selected by the tunable element).

In the case of tunable external cavity lasers that do not comprise a grid generator, the wavelength selection can be made, for instance, by positioning the tunable filter in the desired wavelength and subsequently adjusting the phase of the cavity so that the cavity mode is positioned on the transmission or reflection peak of the tunable filter.

The condition of alignment between the frequency of the cavity mode and the frequency of the selected channel can be achieved and maintained in the time by monitoring the power of the laser output and making some small adjustments to the optical phase of the cavity by acting on one or more parameters of the laser to maximize the emitted optical power. It has been observed that, in the case of dither signals with modulation depths not too high, the peak-to-peak amplitude of the laser signal decreases when approaching the condition of alignment between the frequency of the laser and the frequency of the selected channel, and becomes minimum in the alignment condition.

The Applicant has nevertheless noticed that the value of the amplitude of the AM modulation of the laser signal in the condition in which the frequency of the laser and the frequency of the channel coincide can take a relatively high value or a value not compatible with the ratings of the optical system, especially of laser signals with great line width, for instance, in the case of modulation induced in a phase section integrated in a SOA, not lower than about 0.5 GHz, especially not lower than about 0.8 GHz. Such threshold values are however dependent on several transmitter parameters, particularly of its optical components.

The Applicant has found that, in an external cavity laser including an optical phase element on which a modulation of the length of cavity is applied induced by the modulation of the optical phase of the same element in the alignment condition, it does not correspond, or at least, it not always correspond, the condition of minimum of the peak-to-peak amplitude of the AM modulation of the output signal. In other words, the optical phase value of the cavity corresponding to the condition of minimum of the AM modulation can be different from the phase value that defines the condition of alignment of the cavity to a specific channel. In the case of dither currents with relatively low modulation depth, for instance lower than about 30-40%, the condition of alignment generally coincides, or almost coincides, with the condition of minimum of the AM modulation. Nevertheless, at the higher modulation depths that are often necessary to achieve a laser line widening of more than, for example, about 0.5-0.8 GHz, it has been found that the minimum value of the AM amplitude differs from the position of the relative maximum of the power of the laser signal, and thus it departs from the alignment condition.

The Applicant has conceived a method and an apparatus including an external cavity laser in which the output signal is modulated in frequency with the purpose of increasing the emission spectral width, and particularly the SBS threshold, where the AM amplitude of the laser signal is minimized or at least reduced below a desired value.

The Applicant has in particular realized that in an external cavity laser whose cavity comprises a phase element on which a dither signal and a spectrally selective optical filter are applied, the phase of the cavity can be properly selected in such a way as to reduce the AM component to values lower than those corresponding to a condition of alignment between the frequency of the cavity mode and the frequency of the selected channel.

The Applicant has moreover realized that in an external cavity laser whose cavity comprises a gain medium and a phase element on which a dither signal is applied that causes a variation of the transmissivity within the variation induced by the modulation it is possible to reduce or minimize the amplitude of the modulation of the laser output signal through the application of a suitable modulation to the gain element.

One aspect of the disclosure is directed to a method for operating a laser adapted to emit an output optical signal at at least one center channel optical frequency and that includes an external cavity including a gain medium, a spectrally selective optical filter and a first optical phase element whose phase is controllable through a first control parameter, the method includes:

(a) applying a modulation electrical signal to the first control parameter so as to create a modulation of the length of the cavity optical path with a modulation depth that causes an excursion in optical frequency and an amplitude modulation of the output optical signal, wherein the first optical phase element exhibits a variation of optical transmissivity at least within the variation of the first control parameter induced by the modulation signal and wherein the spectrally selective filter has an optical transmissivity variable in correspondence of at least said excursion of optical frequency induced by the modulation electrical signal;

(b) detecting the amplitude of the modulation of the output optical signal; and (c) adjusting the length of the optical path of the cavity in order to select the transmissivity of the spectrally selective filter so that its first derivative in respect of the frequency within the excursion of optical frequency has substantially opposite sign compared to the first derivative of the transmissivity of the first phase element within the interval of variation of said first control parameter, so as to reduce the modulation amplitude of the laser output signal.

Another aspect of the disclosure is directed to a laser apparatus that includes an external cavity laser adapted to emit an output optical signal at at least one central channel frequency, wherein the cavity of the external cavity laser includes a gain medium adapted to emit an optical beam in cavity along a cavity optical axis, a spectrally selective optical filter arranged along say cavity optical axis, and a first optical phase element whose phase is controllable through a first control parameter, said first optical phase element being arranged along said cavity optical axis. The laser apparatus also includes a control circuit that comprises a modulation generator device adapted to provide a modulation electrical signal to said first optical phase element so as to create a modulation of the length of the cavity optical path with a modulation depth that causes an excursion in optical frequency and an amplitude modulation of the output optical signal. The first phase element has an optical transmissivity variable at least within the variation of the first control parameter induced by the modulation signal. The spectrally selective filter has an optical transmissivity variable in correspondence of at least said excursion of optical frequency induced by the modulation signal. The control circuit includes a detector device adapted to detect the amplitude of the modulation of the output optical signal and a regulator device adapted to regulate the length of the optical path of the cavity in order to select the transmissivity of the spectrally selective filter so that its first derivative in respect of the frequency inside the excursion of optical frequency has substantially opposite sign compared to the first derivative of the transmissivity of the first phase element within the interval of variation of said first control parameter. The control circuit also includes a controller adapted to communicate with said regulator device and with said detector device and adapted to generate control signals to control the modulation amplitude of the laser output signal.

Yet another aspect is directed to a method for operating a laser that emits an output optical signal at a laser central frequency and that comprises an external cavity including a semiconductor gain medium and a phase element whose phase is controllable through a control parameter. The method includes applying a first modulation electrical signal to the control parameter so as to create a modulation of the length of the cavity optical path at a modulation frequency and with a first modulation depth that causes an excursion in optical frequency and an amplitude modulation of the output optical signal and simultaneously applying a second electrical modulation signal to the gain medium at said modulation frequency and at a second modulation depth. The method also includes detecting the modulation amplitude of the output optical signal and adjusting the second modulation depth based on the analysis of the modulation amplitude of the laser output signal.

Another aspect of the disclosure is directed to a laser apparatus that includes an external cavity laser adapted to emit an output optical signal at at least one central channel frequency. The cavity of the external cavity laser includes a gain medium adapted to emit an optical beam in cavity along an optical axis and an optical phase element whose phase is controllable through a control parameter. The optical phase element is arranged along the cavity optical axis. The laser includes a control circuit that has a first modulation generator device adapted to provide a first modulation electrical signal to the optical phase element so as to create a modulation of the length of the cavity optical path at an electrical modulation frequency and with a first modulation depth that causes an excursion in optical frequency and an amplitude modulation of the output optical signal. The laser includes a second modulation generator device adapted to provide a second modulation electrical signal to the gain medium at said modulation frequency and with a second modulation depth, a detector device adapted to detect the modulation amplitude of the output optical signal, and a regulator device adapted to adjust the second modulation depth. The controller is adapted to communicate with the regulator device and with the detector device and adapted to generate control signals to control the modulation amplitude of the output optical signal.

The details of one or more implementations of the disclosure are set forth in the accompanying drawings and the description below. Other aspects, features, and advantages will be apparent from the description and drawings, and from the claims.

DESCRIPTION OF DRAWINGS

Like reference symbols in the various drawings indicate like elements.

DETAILED DESCRIPTION

The external cavity laser (ECL) may be a frequency tunable laser that includes a gain medium that generates an optical beam and a tunable filter positioned along the optical path of the beam exiting from the gain medium.

Figure 1:
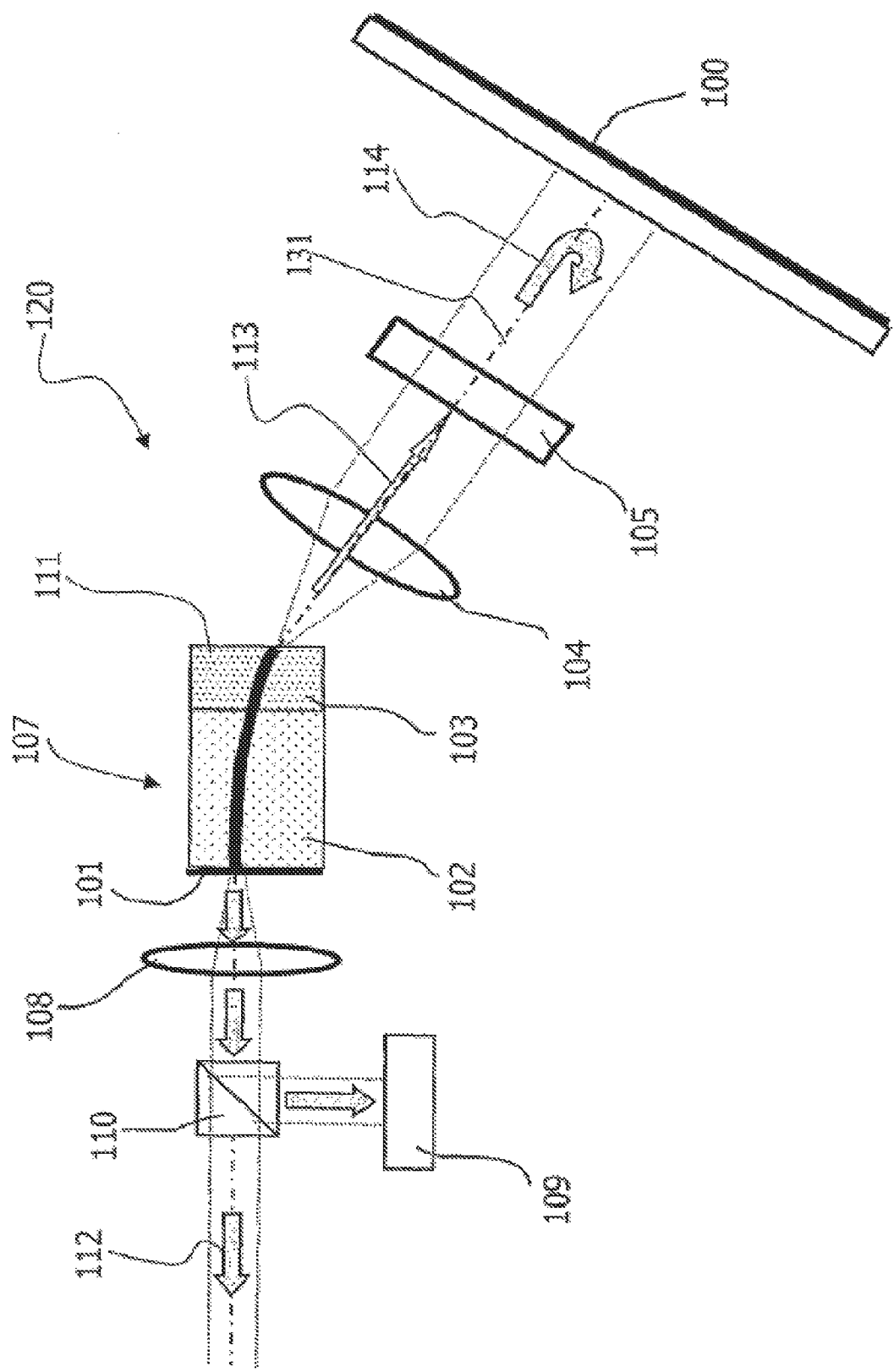
FIG. 1 is a schematic diagram (not in scale) of an external cavity laser.

A schematic diagram is shown in FIG. 1. The laser cavity of an external cavity laser module 120 includes a gain medium 102, an infra-cavity collimation lens 104, a spectrally selective optical filter 105 and a tunable optical filter 100. The optical components in the cavity are arranged along an optical axis 131. The gain medium 102 may be based on a semiconductor laser diode, for instance a multiple quantum well in InGaAs/InP. The gain medium includes a partially reflecting front facet 101 that acts as one of the two end mirrors of the laser cavity. The reflectivity of the front facet can for instance vary from 5% to 30%.

The gain medium is optically coupled to a phase element 103, for instance a current-driven semiconductor device, that can modify the optical path and therefore the optical phase of the cavity, for instance through a variation of the index of refraction of the semiconductor material. In some implementations, the gain medium 102 and the phase element 103 belong to an integrated structure 107, for example, a Semiconductor Optical Amplifier (SOA) with phase section 103, for instance including a semiconductor junction and gain section 102 optically coupled. Examples of the SOA 107 can include a monolithically integrated structure where the sections are formed on a common semiconductor substrate.

The phase section 103 includes a rear facet 111 opposite to the front facet 101 that is an infra-cavity facet and is preferably treated with an anti-reflecting coating for minimizing the reflections at its facet. In some implementations, the gain medium includes a waveguide structure bent in such way to have an angle of incidence on the front facet 101 compared to the direction of the beam exiting from the rear facet 111 to further reduce the back-reflections.

The optical filter 105 may be an optical grid generator that selects the longitudinal periodic modes of the cavity having optical frequencies corresponding to those of the ITU grid and rejects the neighboring modes. The tunable filter selects a channel within the grid of wavelengths and rejects the other channels. In some examples, the filter 105 is a Fabry-Perot (FP) filter.

The tunable filter 100 has the function of channel selector, i.e., it can select the wavelength (frequency) of the laser signal. In the example illustrated in FIG. 1, the tunable filter is an active tunable mirror that forms an end mirror of the cavity. In other words, in the example of FIG. 1, the tunable mirror 100 acts both as end mirror for the laser cavity and as channel selector. An example of active tunable mirror that could be used to this purpose is a mirror based on liquid crystals like for instance the one described in the patent application WO 2005/064365. In some implementations, the tunable mirror has a spectral response with a reflection/transmission peak with FWHM comprised between 40 and 100 GHz, more preferably not greater than 80 GHz.

In a different implementation (not shown), the laser cavity includes an infra-cavity tunable filter, for instance a Fabry-Perot filter that can be tuned thermally or a diffraction grating mechanically tunable (for instance in "Littrow" or "Littmann-Metcalf" configuration), and a reflector that defines an end of the cavity.

The optical beam emitted by the SOA 107 and collimated by the lens 104 (indicate in FIG. 1 by arrow 113) impacts on the FP filter 105 and then onto the tunable mirror 100, that together with the front facet 101 of the gain medium defines the physical length of the laser cavity. The tunable mirror 100 (or, in a different example, a reflector placed downstream an infra-cavity a tunable filter) reflects the optical beam, indicated by arrow 114, back towards the gain medium, resulting in a resonant behavior in the cavity between the tunable mirror and the half-reflecting facet 101. In other words, the optical path from the front facet 101 to the tunable mirror 100 forms a resonator with free spectral range (FSR) that inversely depends on the optical length of cavity. In some implementations, the cavity FSR ranges between 2 and 5 GHz.

The external cavity laser of the shown example can find application as a transmitter in a WDM or DWDM optical system that emits a specific channel frequency or wavelength. In this case, the laser is configured for emitting optical power at a frequency (or wavelength) selected among the plurality of equally spaced frequencies that correspond to the frequencies of the channels in a WDM and DWDM system. The frequencies of the transmission peaks of the FP filters correspond to those defined by the ITU standard grid. In an embodiment, the laser 120 can be tuned to the wavelengths of the C band (1525-1565 nm), of the L band (1565-1610 nm), or both (1525-1625 nm).

The optical beam that exits of the laser cavity through the partially reflecting front facet 101 passes through a collimating lens 108 that collimates the light in an output optical beam that passes through a beam splitter 110 to spill a small portion of the beam (typically of about 1-2%) so that such portion of the laser output can be measured by a photodetector 109, for instance a photodiode. Since the current generated by the photodiode is proportional to the intensity of the output optical beam, it is possible for instance to monitor in the time the output power, as described more in detail in the following.

In some implementations, the spectral width of the output signal of the external cavity laser is increased by modulating the length of the optical path of the cavity so as to produce a frequency modulated stimulated laser emission. The excursion in frequency of the modulated signal, that mainly determines the width of the power spectrum of the laser output signal, may be selected in such way as to reduce the undesired SBS effect.

In the example of FIG. 1, the widening of the optical spectrum is achieved by applying a frequency modulation electrical signal (dither) to the phase element 103. For instance, an alternate current is applied to the phase element 103 with (electric) frequency $f_d$ that can be superimposed to a continuous bias current $I_{ph}$. In case the phase element is a phase section of a SOA, the bias current biases the semiconductor junction included in the phase section.

In some implementations, the excursion in optical frequency of the laser signal caused by the dither is lower than the spacing of the cavity modes. For instance, if the FSR of the cavity is 3-4 GHz, the excursion in optical frequency that determines the line width of the output signal is preferably selected so as to be not greater of about 1.5 GHz.

In some implementations, it can be advantageous to apply a modulated current with triangular waveform, that can result in a higher SBS threshold compared to that corresponding to a sinusoidal signal, at equal spectral widening.

Figure 2:
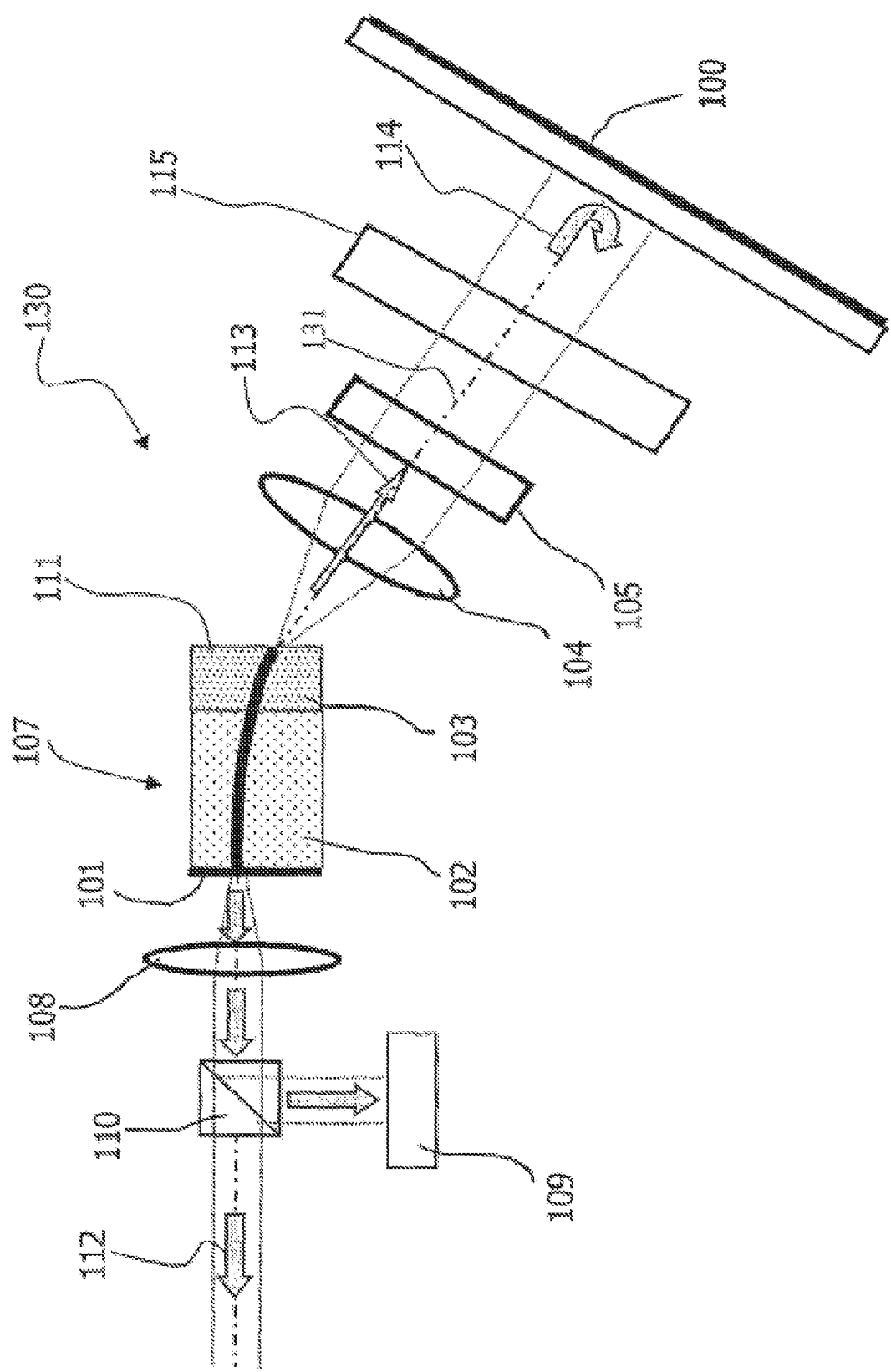
FIG. 2 is a schematic diagram (not in scale) of an external cavity laser.

FIG. 2 is a schematic diagram of an external cavity laser. The same reference numerals are assigned to the elements of the ECL corresponding to those shown in FIG. 1. Compared to the embodiment of FIG. 1, the external cavity laser 130 includes a further infra-cavity phase element 115, adapted to tune the optical phase (phase-tuning element) of the cavity and whose optical length is controllable through a control parameter, like the temperature or the voltage.

In the example of FIG. 2, the phase-tuning element is shaped in such way to exhibit an optical transmissivity substantially independent from the wavelength of the optical beam that crosses it, at least in the interval of wavelengths of interest, for instance in the C band and/or the L band. In other terms, the phase element doesn't introduce any significant optical losses and is therefore a substantially transparent element in its interaction with the optical beam in cavity. For instance, the material or the materials that form the phase element 115, at least in the portion that interacts with the optical beam, are optically transparent, always in the interval of wavelengths of interest.

Thus, in the example of FIG. 2, the laser cavity includes two infra-cavity phase elements, i.e. the phase section 103 and the phase-tuning element 115. In the example of FIG. 2, the phase-tuning element is positioned between the FP filter 105 and the tunable mirror 100. Nevertheless, in a different example, the phase element 115 can be arranged between the collimator lens 104 and the filter 105.

Advantageously, the introduction of a phase tuning element controllable through a control parameter allows a fine tuning of the phase of the cavity.

A drift in the output of the ECL can take place due to the aging, such as the aging of the laser diode, mechanical variations in the complex of the optical elements of the cavity. A drift can take place if the operating condition of the ECL is at an external temperature that differs largely from the temperature at which the laser is stabilized. The stabilization of the operating temperature of the laser is typically achieved through for instance a thermo-electric cooler (shortened with TEC). This last condition could for instance occur when the temperature gradient between the external temperature and the stabilized temperature is higher of about 20° C. A relatively high temperature gradient can induce some mechanical deformations of the support plane of the TEC, that in turns lead to variation in the length of the optical path of the cavity. As a result of the aging, the laser output power decreases, sometimes to such a substantial an extent in the time that is no more possible at the same time to maintain the condition of alignment and to reestablish the initial power value. In some implementations, the phase-tuning element is able to introduce in the cavity a variation of phase that compensates the output power fall due to the aging of the device or to a relatively high variation of the external temperature. The external parameter that controls the phase-tuning element can for example be increased for bringing the power to a value close to the initial value.

In some implementations, the phase element is controllable thermally, i.e. the phase delay of such element varies in dependence of the variation of the temperature. In some examples, the phase element includes a material with an index of refraction that varies with the temperature.

In some implementations, the phase-tuning element is a silica film. The silica has the advantage of having an index of refraction that relatively varies significantly for small variations of temperature, for instance for few degrees Kelvin. At the wavelength of 1550 nm, the index of refraction, $n_{Si}$, at 300K it is 3.477 and $dn_{Si}/dT$ is $4.6 \times 10-5$. Additionally, silica is transparent to the infrared wavelengths at which the optical communications operate. The relatively high thermal conductivity (about 125 W/mK) of silica allows a uniform heating of the film. Another advantage of the silica is the lower cost of the material and its easy manufacturability.

Although the variations of the index of refraction of the silica with the wavelength of the incident beam optical have to be considered, in the practice these variations are not significant in the interval of wavelengths in which the tunable ECL typically operates.

The maximum temperature variation of the thermo-controllable phase element can be selected in dependence of the number N of cycles of the phase of the laser cavity (i.e., 2Nπ), that are desired or necessary to compensate for the aging of the ECL in its lifetime.

By way of example, a total variation of 3.8° C. can produce up to a cycle of phase of 2π in a film of silica of 1.25 mm thickness. For a same silica film, the relationship between the variation of the temperature and the cycles of phase is approximately linear. Then, a cycle of phase of 4π corresponds to a variation of temperature of 7.6° C.

It can be noted that the phase-tuning element, differently from the gain medium, is not bound in its operation to a specific value of maximum temperature, and thus the number N of cycles of phase can in principle be higher than 1. When an ECL is designed, it is possible to assess, for example through computer simulations, the effects of aging during the life of the device, and from these to extract the number of cycles of phase that are necessary to compensate such effects. From this number, it is possible to derive the maximum variation of temperature necessary to achieve a regulation of optical phase of the cavity compensating at the same time the adverse effects of the aging.

The phase condition of the laser cavity illustrated in FIG. 2 (in case the phase element 115 has a phase delay dependent on the temperature) is achieved if the following relationship is satisfied:

$$2\Phi_G(I_G)+2\Phi_{ph}(I_{ph})2\Phi_{FS}+2\Phi_{FP}+2\Phi_{PE}(I_H)+\phi_{R2}=2N\pi \quad (2)$$

where N is an integer different from zero, $\Phi_G$ is the phase delay introduced by the laser diode 102 (that depends on the injection current IG), $\Phi_{ph}$ is the phase delay introduced by the phase section 103 (that depends on the current $I_{ph}$ that it flows therethrough), $\Phi_{FP}$ is the phase delay introduced by the etalon, $\Phi_{FS}$ is the phase delay introduced by the free space, $\Phi_{PE}$ is the phase delay introduced by the phase element 115 (that depends on its temperature, for instance from the current that it flows in a heater thermally coupled thereto) and $\Phi_{R2}$ is the phase delay introduced by the tunable mirror.

In general, the lasering condition at the threshold of a laser in which the cavity optical losses and gain (condition of energetic balance) compensate can be expressed by the relationship $$r_f r_b \alpha \cdot G_{th} \cdot \exp(i\Phi)=1 \quad (3)$$

where $r_f$ is the reflectivity of the front minor of the gain element, $r_b$ is the reflectivity of the minor set at the other end of the cavity and $\Phi$ it is the sum of the optical phases of the optical elements in the cavity expressed by the relationship (2). The parameter $\alpha$ is the total optical transmissivity of the cavity, given by the product of the transmissivities of the optical elements presents in cavity in roundtrip, for instance the FP filter ($\alpha_{FP}$), the phase section ($\alpha_p$), the collimating ($\alpha_{lens}$), etc.:

$$\alpha=(\alpha_{FP}\cdot\alpha_{ph}\cdot\alpha_{lens}\dots)^2 \quad (4)$$

The squared factor keeps track of the fact that, in the calculation of the loop gain the optical beam experiences a double passage through the elements of the cavity.

The parameter Gth is the net gain of the gain medium, defined as $$G_{th}=e^{2gL_g} \quad (5)$$

where $L_g$ is the physical length of the gain medium and g is the gain for unit length.

Although, in the example shown in FIG. 2, the laser cavity includes a phase element 103 on which a dither signal is applied and a phase-tuning element 115 that allows the adjustment of the optical phase of the cavity, in some implementations, the phase element for the regulation of the cavity phase through the adjustment of a control parameter is the same phase element on which the dither signal is applied for causing a widening of the line of the output laser signal. A dither signal is for instance applied to the phase section optically coupled to the gain medium and its phase is controllable through adjustments of the bias current.

In some implementations, the laser cavity does not include a phase section optically coupled or integrated to the gain medium, but comprises a different infra-cavity phase element whose phase can be controlled through a control parameter, for instance the supply voltage or the temperature, and on which a dither signal is applied.

The presence of two distinct phase elements in the cavity can be advantageous (but not necessary) when it is not possible to have a phase element that has both a response time of the variation of phase sufficiently high to produce modulations in frequency of the order of the kHz (typically adopted), and a regulation of the phase with a number of phase cycles higher than one.

Finally, examples are contemplated in which the laser cavity of the ECL comprises a phase element on which a dither signal is applied so as to induce a modulation of the output optical frequency and in which the cavity optical phase is regulated by the adjustments of the gain current, IG, supplied to the gain medium.

Figure 3:
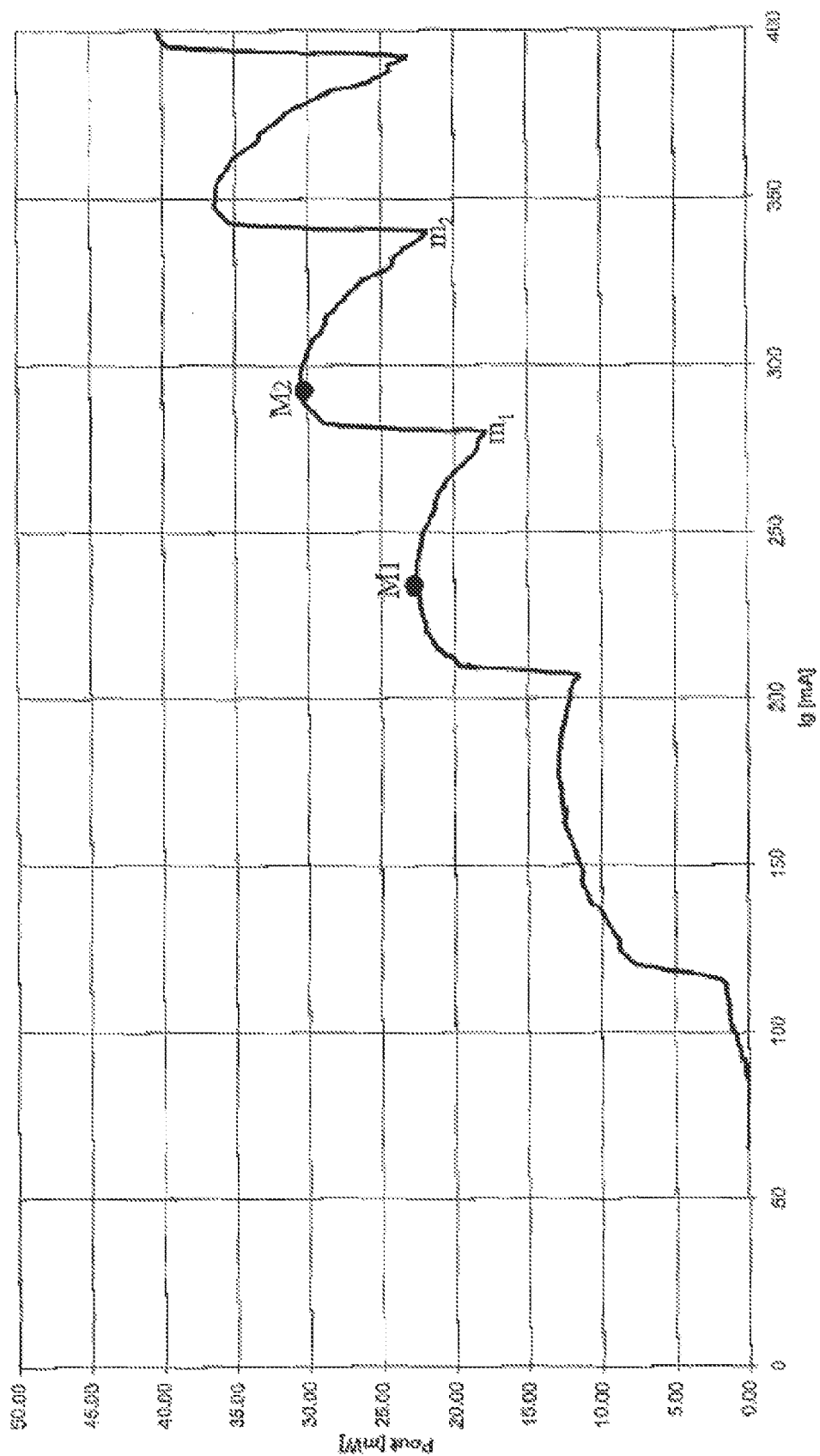
FIG. 3 reports an exemplary measure of the power of the output optical signal for a laser of the type shown in FIG. 1 or FIG. 2 as a function of the gain current of the gain medium.

FIG. 3 reports an exemplary measure of the output power of the laser of FIG. 1 or FIG. 2 as a function of the gain (or injection) current of the laser diode, $I_G$. The local maxima of the output power (two maxima are indicated by way of example in FIG. 3 with $M_1$ and $M_2$) correspond to the condition of alignment of the cavity mode substantially centered with the peak of the selected etalon, while the local minima (indicated with $m_1$ and $m_2$) correspond to the condition of mode hopping. In the condition of mode hopping, the mode of the laser signal jumps between the longitudinal cavity modes, resulting in a sudden and discontinuous variation in the wavelength of the laser output and in the power.

The channel centering and the stability in frequency can be achieved by monitoring the output power and operating small adjustments to a laser parameter that controls the phase of the cavity, like the injection current of the gain medium to bring the power to a maximum value. A variation in the injection current induces a variation in the index of refraction of the gain medium and therefore a variation of the phase of the laser cavity. A control algorithm can maintain the centering of the selected channel by adjusting the injection current in such way as to operate in the points of local maximum (e.g. in the point M2). Alternatively, and always by way of example, adjustments to the length of the optical path can be achieved, for instance, through the control of the temperature of a thermo-controllable phase element.

The Applicant has started with the observation that in the case of laser signals with relatively low spectral widening (e.g. lower than 0.5 GHz) the amplitude of the AM modulation of the laser signal decreases down to reach a minimum in the condition of alignment (for instance in the point M2), correspondent to the alignment between the frequency of the selected channel and the frequency of the cavity mode.

The Applicant has nevertheless noticed that the value of the amplitude of the AM modulation of the laser signal in the condition in which the frequency of the laser and the frequency of the channel coincide can take a relatively high value, for instance higher than 5-6%, or not compatible with the ratings of the optical system, especially in the case the modulating signal has such a modulation depth as to induce laser signals with relatively wide line width. For instance, in the case of modulation induced in a phase section of integrated in a SOA, this can happen for modulations that produce a line width not lower than about 0.5 GHz and especially not lower than about 0.8 GHz. It is nevertheless noticed that such "threshold" values can be also dependent on the transmissivity curve of the phase element on which the modulation signal is applied. Generally however the phenomenon is observed in laser signals generated by an ECL for telecommunications applications with line widths of the order of 1 GHz.

Making reference to a configuration of the ECL of the type represented in FIG. 1 or 2, the current $I_{ph}$ that flows in the phase section generates a variation $\Delta n$ of the index of refraction of the materials that compose it, that as a result produces a variation of the optical frequency emitted by the laser according to the following approximate relationship:

$$v \approx v_0\left(1 - \Delta n(I_{ph}) \cdot \frac{L_{ph}}{L}\right) \quad (6)$$

where $v_0$ is the emission frequency for $I_{ph}=0$, $\Delta n$ is the variation of the index of refraction of the phase section (dependent on the current), $L_{ph}$ is the optical length of the phase section and L is the optical length of the whole cavity. The function that links $\Delta n$ and $I_{ph}$ to each other depends on the physics of the device and can empirically be derived for instance by optical measures made on the same.

Figure 4:
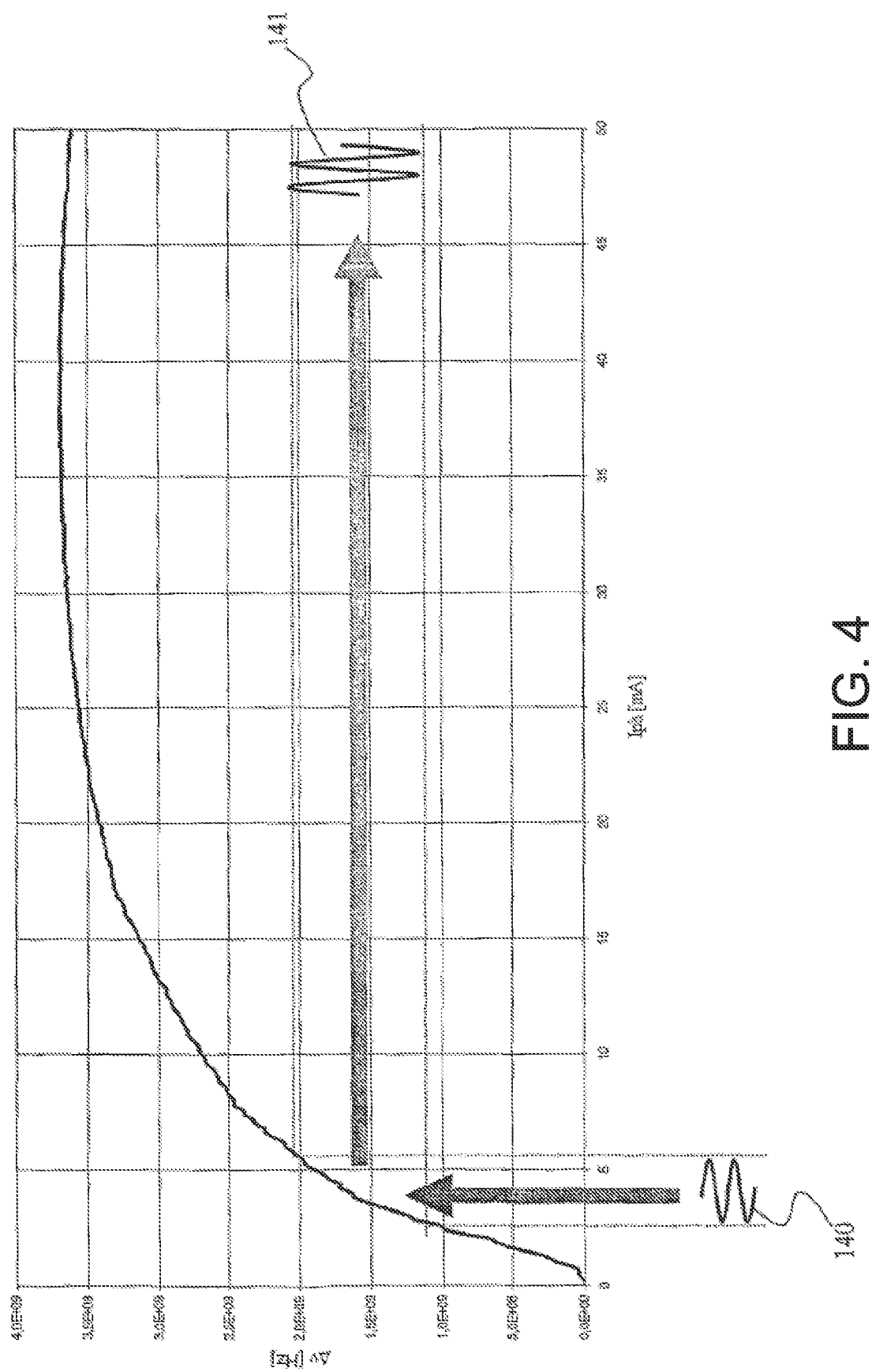
FIG. 4 reports an experimental measure of the variation of the optical frequency of the output optical signal as a function of the continuous bias current applied to the phase section.

FIG. 4 reports an experimental measure of the variation of the optical frequency of the output signal (continuous line) as a function of the continuous bias current $I_{ph}$ applied to the phase section. In the start situation ($I_{ph}=0$), the external cavity laser works in such a way as to emit a signal at a certain optical frequency $v_0$ correspondent to a specific laser channel. At the frequency $v_0$ there correspond therefore a certain value of cavity phase and a certain gain current, $I_G$. As the continuous component of the phase current, $I_{ph}$, increases, the variation of the output frequency, $\Delta v=(v-v_0)$, is reported in ordinate (continuous line). When to a bias current $I_{ph}$ a modulated current is superimposed having electric frequency $f_d$ and indicated schematically with the waveform 140 in FIG. 4, a modulation in optical frequency, indicated with the waveform 141, is generated in the laser output signal.

The application of the bias current to the phase section 103 does not only involve a variation of the phase and thus of the average optical frequency of the emitted laser signal, but also a variation of the instant transmissivity of the phase section, mainly due to physical phenomena that lead to the change of the transparency of the medium as the current flowing therethrough varies.

Figure 5:
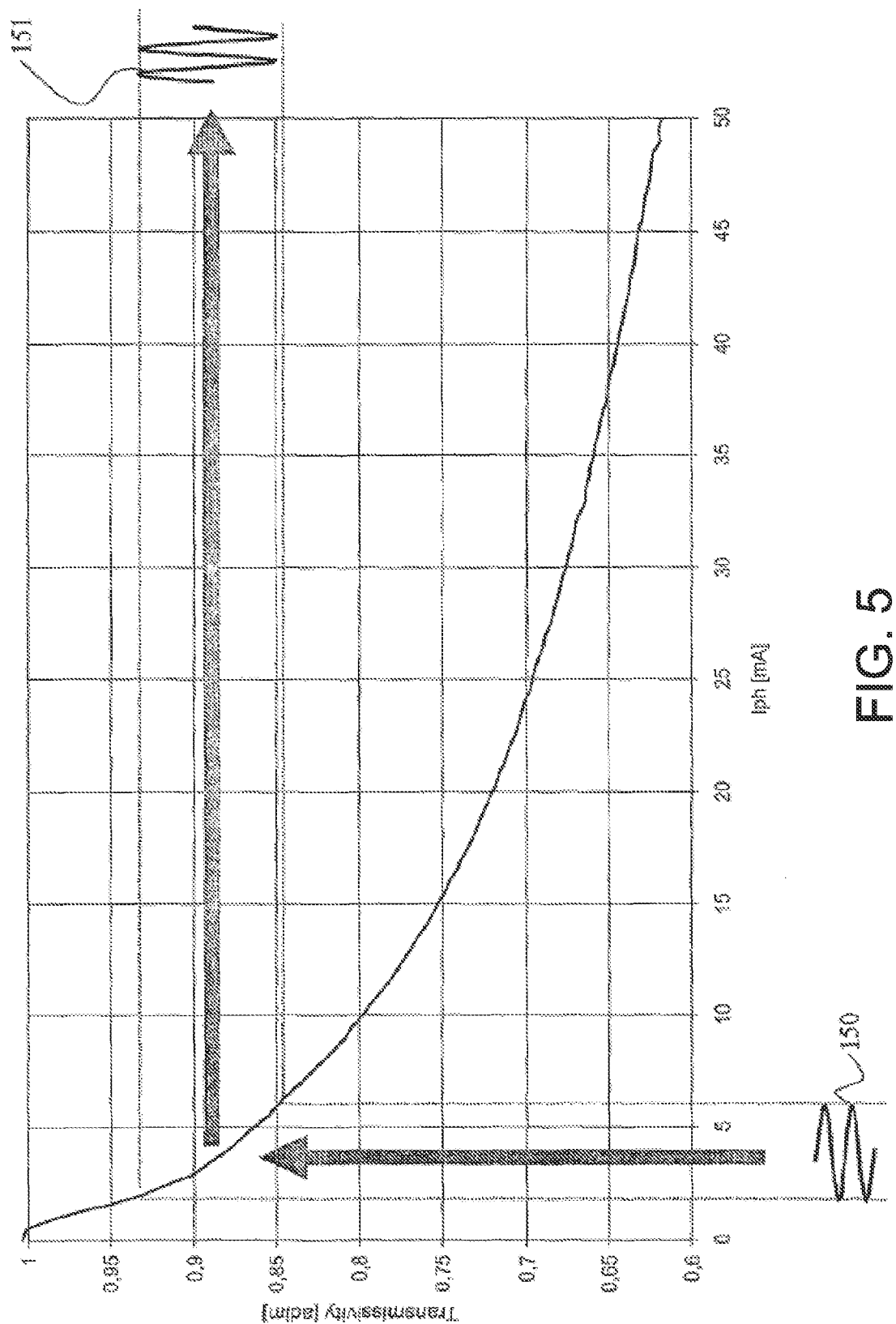
FIG. 5 shows the normalized transmissivity of the phase section measured as a function of the bias current (continuous component) applied thereto.

FIG. 5 shows the normalized transmissivity of the measured phase section as a function of the bias current (continuous component), $I_{ph}$, applied to the section itself. It can be observed that the transmissivity decreases in non-linear way as the bias current increases, thereby inducing an cavity optical loss that increases as the value of $I_{ph}$ increase. The transmissivity of the phase section can be expressed as a function of the phase current an empirical relationship:

$$\alpha_{ph} \approx \sqrt{1 - a \cdot \ln\left(\frac{I_{ph}}{b}\right)} \quad (7)$$

where a and b are empirical coefficients.

Thus, when a frequency modulated signal indicated in figure with the waveform 150 is applied to the phase section, not only is a phase a modulation of the element itself generated (and therefore of the length of the cavity optical path), but also a modulation of the transmissivity, and therefore a modulation of intensity of the optical signal, indicated in the figure with the waveform 151. For instance, a modulating signal with modulation depth of around 80% and $f_d=10$ kHz can cause a percentage value of AM modulation in the laser signal owed to the losses in transmissivity of the phase section of around 20%.

The percentage value of the electrical modulation depth is defined as the relationship between the peak-to-peak amplitude of the modulated component of the electrical signal (in this case, for instance, an alternate current) and the continuous component of the signal (in this case, the bias current). In general, reference will be made to the modulation depth as the peak-to-peak amplitude of the electrical modulation signal.

The percentage value of the optical AM of the laser signal is here defined as the relationship between the peak-to-peak amplitude of the modulated component and the continuous component of the optical power emitted by the laser. Hereinafter, reference will be made to the percentage value of the optical AM or to the peak-to-peak amplitude of the AM component of the laser signal. In general, reference will be made to the amplitude of the optical modulation signal that can indicate either one of the quantities. The continuous component of the power of the laser output signal is typically represented by the detected value of average power, i.e. the average value of the oscillating power values, such power oscillation being caused by the intensity modulation of the signal.

The Applicant has noticed that the peak-to-peak amplitude of the modulated component does not significantly change as the current $I_G$ applied to the gain medium varies. It follows that the percentage value of the AM modulation in comparison to the output signal grows as the value of the power of the output signal, $P_{OUT}$, that is introduced in fiber, decreases. This effect can be particularly undesired in the case it is desired to obtain a transmitter in which the output power can vary, for instance in dependence of the ratings of the optical system in which it is used, in a relatively ample interval, for instance from 5 dBm to 20 dBm.

The Applicant has observed that in an external cavity laser that comprises a spectrally selective optical filter, thus that introduces optical losses in cavity, as it is for example the case of a infra-cavity FP filter, the presence of the filter itself can produce an AM modulation in the laser signal as a result of the dither signal.

Figure 6:
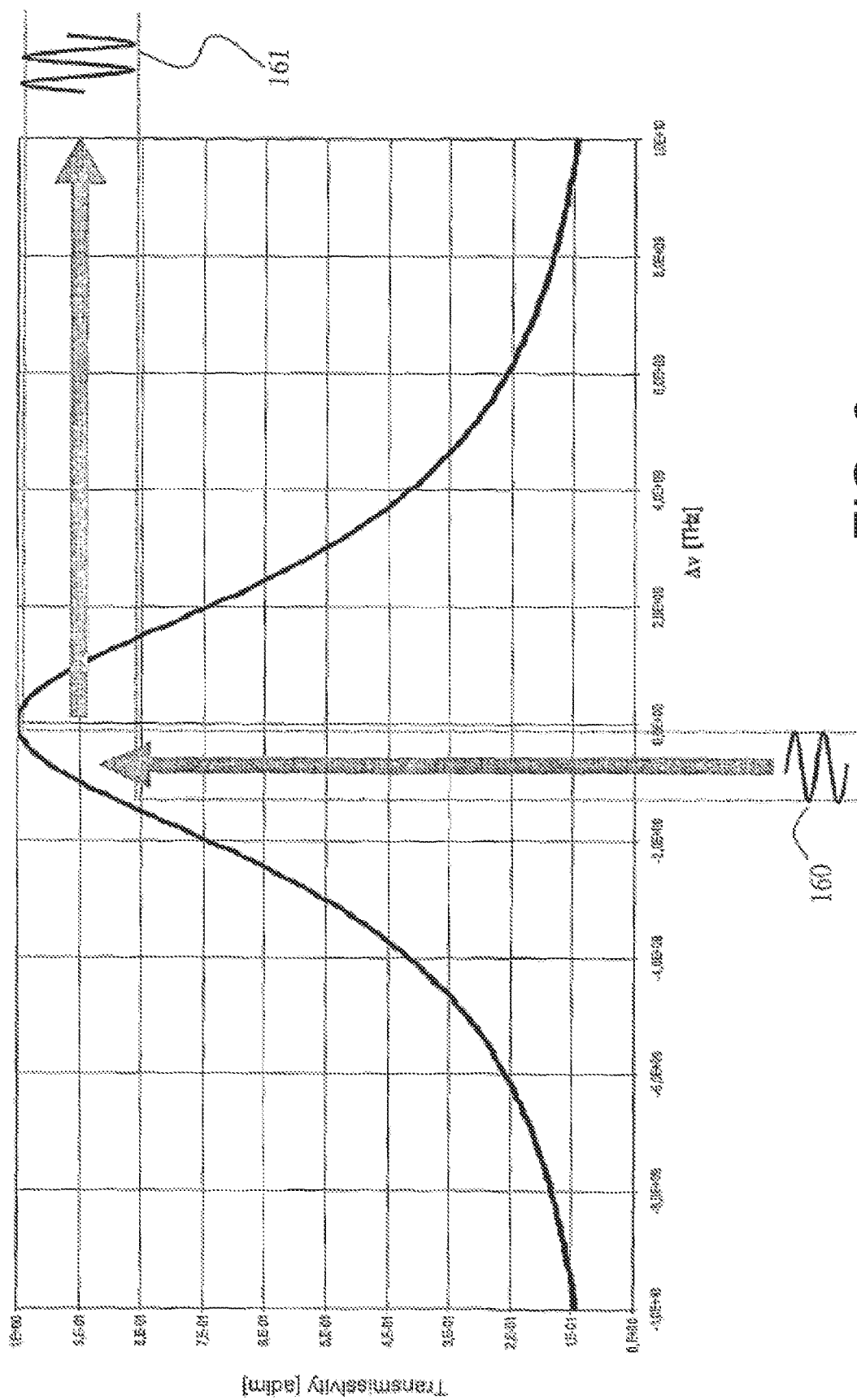
FIG. 6 illustrates by way of example a transmission band as a function of the optical frequency of a Fabry-Perot filter.

The optical transfer function of a FP filter includes a series of equally spaced peaks. FIG. 6 illustrates by way of example a single transmission band of a FP filter with FWHM of 6 GHz. In the alignment condition, the cavity mode with frequency selected by the tunable filter (i.e., the selected channel) is positioned in correspondence of the transmission peak of the filter. This condition is equivalent to select the optical phase of the cavity equal to a (relative) maximum of $P_{OUT}$.

The presence of a modulation of the optical length of the cavity induces an oscillation of the output optical frequency corresponding to the electrical dither frequency $f_d$ (schematically represented by the waveform 160). In turn, this causes a modulation of the transmissivity introduced by the FP filter, schematically represented in figure by the waveform 161, and therefore it causes an AM modulation in the laser output signal.

In some implementations, the spectrally selective optical filter has a FWHM comprised between 3 and 20 GHz, for example, between 4 and 15 GHz or between 5 and 10 GHz. The maximum tolerated FWHM is advantageously smaller than the frequency spacing of the cavity resonance modes (cavity FSR) that is in relationship with the optical length L of the cavity itself.

With reference to the relationship (4), the transmissivity of the external cavity, for a cavity that comprises an optical phase element (e.g. the phase section) and a spectrally selective optical filter is subject to a variation $\Delta \alpha$, and it varies as a function of the contribution due to the loss of transmissivity in the phase section, and of the contribution due to the loss in transmissivity in the etalon, and can be expressed by the relationship:

$$\alpha + \Delta\alpha = (\alpha_{FP} + \Delta\alpha_{FP}) \cdot (\alpha_{ph} + \Delta\alpha_{ph}) \cdot \alpha_{lens} \quad (8)$$

With the purpose of minimizing the variations of the transmissivity of the laser cavity owed to the dither, and therefore to the AM modulation of the output optical power, the following relationship should be satisfied (the higher-order term $\Delta\alpha_{FP} \cdot \Delta\alpha_{ph}$ is neglected):

$$\alpha_{FP} \cdot \Delta\alpha_{ph} = -\alpha_{ph} \cdot \Delta\alpha_{FP} \quad (9)$$

or, in the neighbor of the optical frequency defined by the optical carrier of the laser signal:

$$\alpha_{FP} \cdot \frac{d\alpha_{ph}}{dv} + \alpha_{ph} \cdot \frac{d\alpha_{FP}}{dv} = 0 \quad (10)$$

Figure 7:
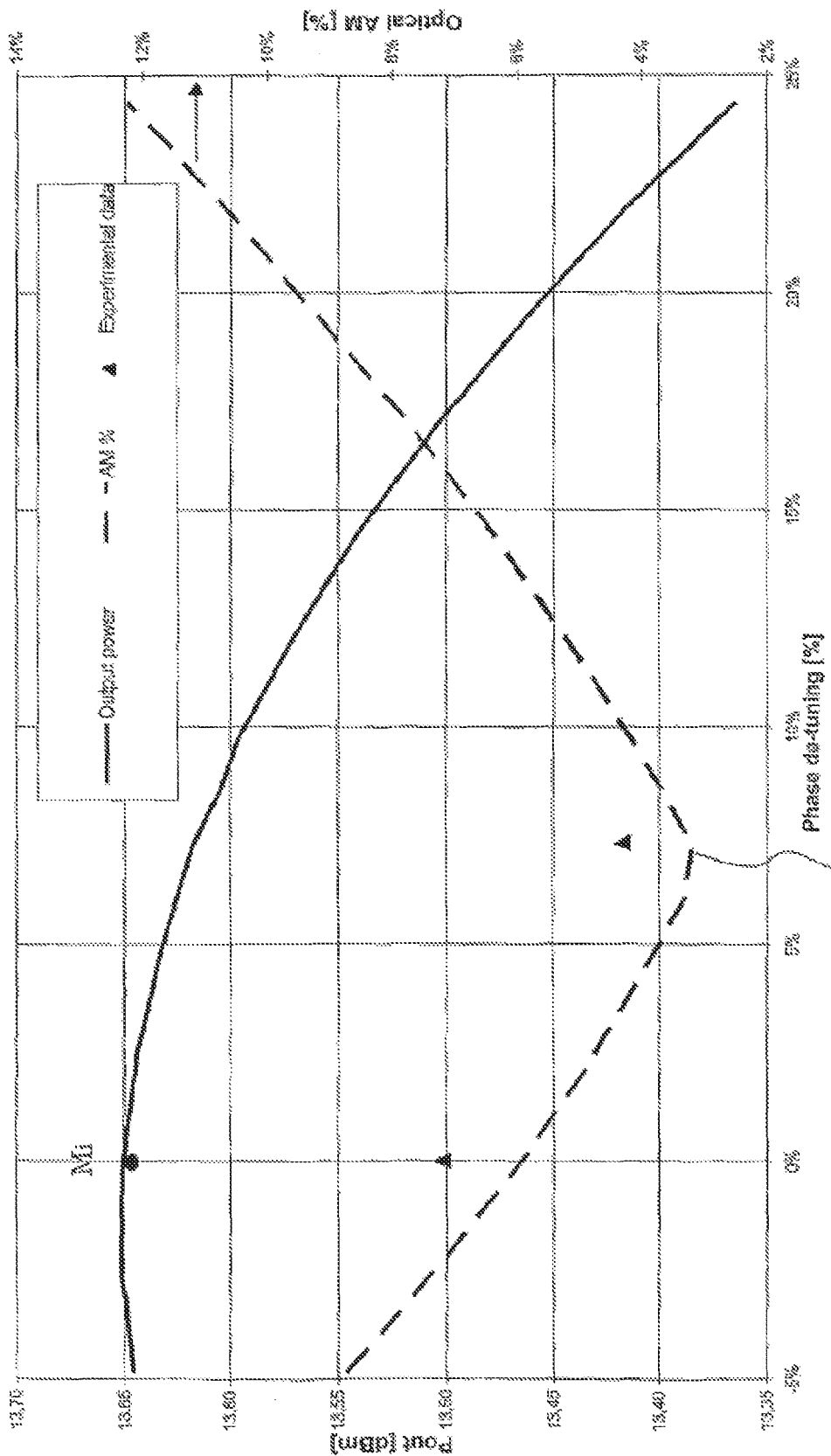
FIG. 7 reports results of numerical simulations in which the continuous component of the power of the laser output signal and the percentage value of the AM modulation of the output optical power are calculated as a function of the de-tuning of the phase of the laser cavity.

FIG. 7 reports results of numerical simulations in which the continuous component of the laser output power, $P_{out}$, (continuous line, ordinate at the right) and the percentage value of the AM modulation of the output optical power (dashed line, ordinate at the left) are calculated as a function of the phase mismatch or de-tuning of the optical phase of the laser cavity, $\Delta\Phi = \Phi - \Phi_D$, where $\Phi$ is the cavity phase value in the condition of alignment and $\Phi_D$ is the input phase value. In the figure, the full triangles represent the result of experimental measures on the AM component. The condition of alignment of the cavity corresponds to the condition of maximum transmission of the etalon at the selected channel, i.e., a cavity mode is centered under the peak of the etalon at the frequency of the selected channel. In such condition, to the value $\Phi$ there corresponds therefore the point of (relative) maximum of the continuous line that represents the power, indicated with $M_i$ in FIG. 7, corresponding in the abscissa axis to a 0% out-of-phase ($\Phi_D = \Phi$). As previously described, and by of example only, one of the ways to tune the phase of the laser cavity can be through an adjustment of the injection current of the gain medium. In this case FIG. 7 can represent a portion of FIG. 3 in an interval that comprises a point of relative maximum of $P_{out}$.

Alternatively, the phase mismatch (or alignment) can be achieved by acting on a infra-cavity phase element, like a phase section integrated into the gain section of a SOA or a different phase element.

The exemplary values reported in the diagram of FIG. 7 relate to a signal generated by a phase current having continuous component (bias) $I_{ph} = 5$ MA and alternate component having frequency $f_d = 10$ KHz and modulation depth optimized in every point, so as to obtain a widening of the optical spectrum equal to 1.2 GHz. The current of the gain section is equal to $I_G = 250$ MA.

In the considered phase mismatch interval, the intensity modulation of the output power takes a minimum value indicated in the figure with $a_i$ that corresponds to a certain phase mismatch value $\Phi F$. The values $M_i$ and $a_i$ do not correspond to the same value in abscissa, thus to the same value of the optical length of the laser cavity. In the example of FIG. 7 the value of the AM modulation in the point of minimum $a_i$ is equal to about 3%, while it is equal to about 6% in correspondence of the value of maximum of power, $M_i$.

For ECL configurations typically used in optical transmission systems and for line width values of the laser signal not higher than about 2 GHz, the condition of minimum of the AM amplitude remains close to the maximum of the output power, for instance the output frequency differs from the channel frequency, that in the case of an ECL operating in the C and/or L bands generally varies between about 186 and 196 THz, of few hundred of MHz with consequent loss of power in the output signal due to the de-tuning of the cavity to reduce the AM component of the acceptable signal. In some implementations, the difference in power between the maximum value and the value corresponding to the minimization of the optical AM is lower than 1 dB, more preferably lower than to 0.5 dB and even more preferably lower than to 0.2 dB. In the example of FIG. 7, the power reduction is lower than 0.1 dB.

It is believed that in the case of the ECL comprising a phase element to which the modulation is applied and a spectrally selective filter, the condition of minimum in the AM modulation is the result of an at least partial compensation of the contribution to the AM modulation generated by the phase element (e.g., the phase section 103) with the contribution to the AM modulation generated by the spectrally selective optical filter, e.g., the FP filter.

The transmissivity of an FP filter can be expressed by the relationship $$\alpha_{FP} \approx \frac{1}{\sqrt{1 + \frac{(v - v_M)^2}{FWHM^2}}} \quad (11)$$

where $v_M$ is the optical frequency for which there is a maximum of transmissivity (in correspondence of the peak) and FWHM is the full width half maximum of the transmission band of the filter under which there is the lasering cavity mode. From the relationship (9), the variation of the transmissivity for unit frequency, or derivative $d\alpha_{FP}/dv$ can be derived.

The contribution generated by the phase section, $d\alpha_{FP}/dv$ is given by the derivative of the relationship (7). The derivative of the transmissivity of the phase section as a function of the cavity phase variation shown in FIG. 4 is negative in the considered interval and particularly in the interval corresponding to the variation of the current $I_{ph}$ induced by the modulation. The derivative of the transfer function of the etalon is positive for frequencies lower than the peak frequency, and negative for higher frequencies.

The relationships (9) and (10) represent an ideal condition of minimum of the variation of transmissivity of the cavity that however is not necessary, since a reduction of the AM modulation due to the phase section can be reached when the value of the right term of the relationship (10) reaches a minimum value that is not necessarily null. For instance, it could be not possible to completely delete the two contributions (for instance because of the difference of the transfer functions of the two optical components). A compensation of the two contributions, even if partial, leads to a reduction of the optical AM of the laser signal.

In the example reported in FIG. 6, a value of $d\alpha_{FP}/dv$ of opposite sign compared to that of $d\alpha_{ph}/dv$, and thus positive, is obtained at lower frequencies compared to that corresponding to the peak of the transmission band of the spectrally selective filter. The cavity mode (arrow) is depicted as positioned at slightly lower frequencies compared to the peak frequency.

In case of a phase element on which the modulation signal is applied that exhibits a transmissivity inside his interval of variation with positive first derivative, an at least partial compensation of the variation of the transmissivity of the cavity is achieved by selecting transmissivity values of the spectrally selective filter with negative first derivative, within the excursion of the optical frequency.

The derivative of the transmissivity of the phase element and the spectrally selective filter can be substantially of opposite sign, in the sense that is not necessary (even if preferable) that they are like that in all the points of the interval corresponding to the excursion of the transmissivity due to the modulation as long as they are of opposite sign in substantial way to create an at least partial compensation of the two contributions.

Incidentally, it is noticed that for modulations with relatively small modulation depth, the variation of the transmissivity induced by the modulation is less significant and therefore the condition of alignment that is reached by positioning the cavity mode substantially under the peak of the FP filter can represent the desired operating condition of the ECL.

The Applicant has found that it is possible to implement a method of control of the AM amplitude in the signal emitted by an ECL that comprises a phase element with variable transmissivity induced by the modulation and a spectrally selective optical filter and that selects and maintains the AM amplitude below a certain desired value. The desired maximum amplitude value can depend on the characteristics or specifications of the optical system in which the transmitter comprising the ECL is implemented. The control can for instance be performed so as to keep the percentage value of the AM amplitude not higher than 5-6%, or than 4%, also in dependence of the specifications of the optical system. In some implementations, the control method acts on the phase of the cavity so as to minimize the AM component of the output power.

In the examples of FIGS. 1 and 2, the spectrally selective filter is the FP filter 105 whose peaks have a bandwidth lower than the bandwidth of the spectrum of the tunable filter. For instance, the FP filter has a periodic spectrum with transmission bands with FWHM equal to 6 GHz and the tunable filter has a transmission (or reflection) band of about 70 GHz.

According to a different example (not shown), the laser cavity includes as output signal channel selection element only a tunable filter, and not a grid generator (i.e. no FP filter is present in the cavity). In this last case, the tunable filter acts as spectrally selective optical filter and needs to have at least a portion of the pass band with first derivative of the transmissivity of opposite sign compared to the first derivative of the transmissivity of the phase element, in the interval of optical frequencies interested by the dither modulation. In some implementations, in this configuration, the tunable filter has a transmission or reflection spectrum with a FWHM comprised between 5 and 20 GHz.

Figure 8:
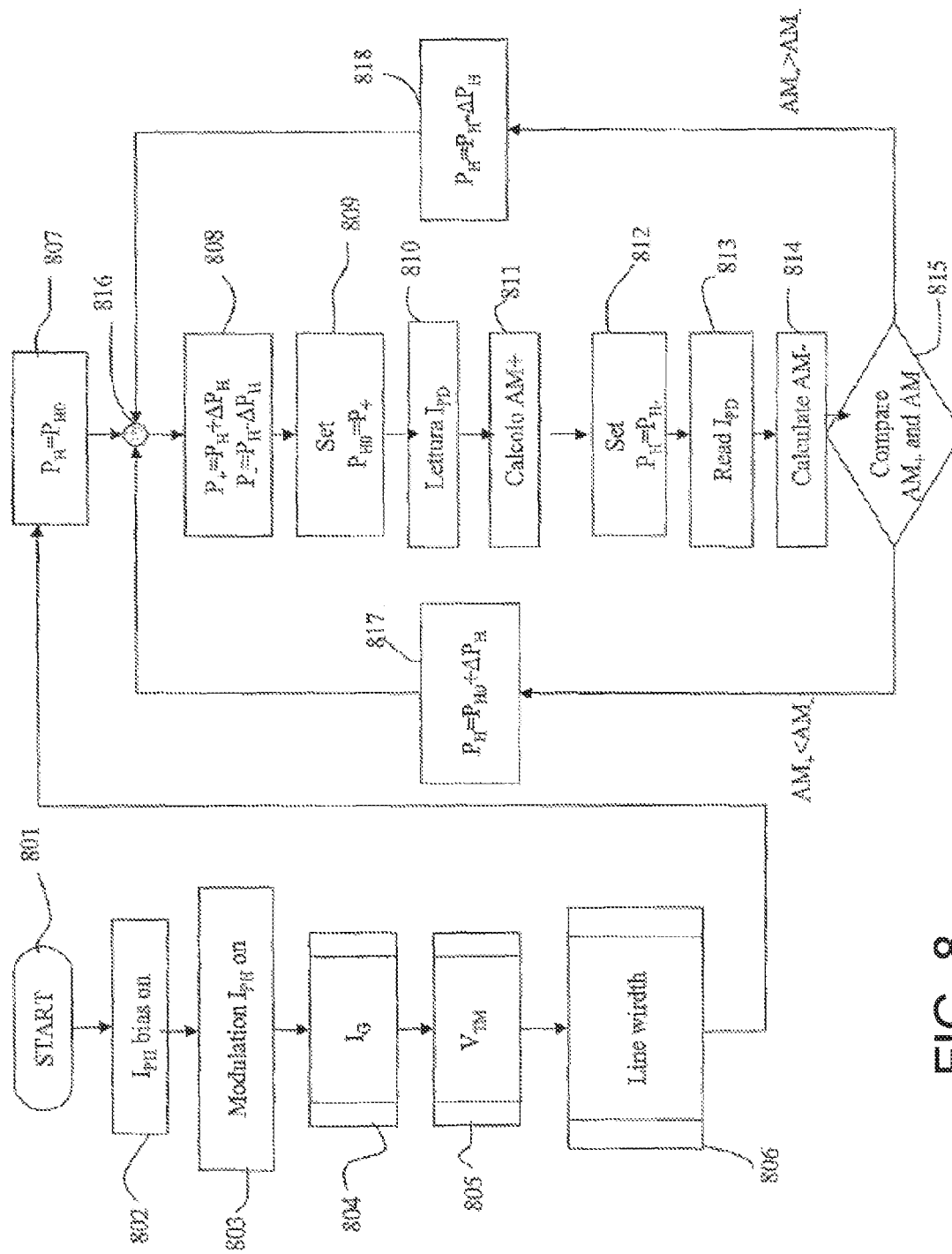
FIG. 8 illustrates a process flowchart that represents a laser control method.

FIG. 8 depicts a flowchart of a process 800 that represents a tunable laser control method according to a preferred embodiment of the present invention. The method can be implemented in a control algorithm that uses a loop to keep the phase in the condition that corresponds to the minimization or to a reduction of the modulated component of the output power.

At process step 801, the laser is turned on. The bias value of the dither signal that generates a phase current, $I_{ph}$ is input as input value into the algorithm (step 802). The frequency modulation signal is then turned, for instance a sinusoidal or triangular signal with frequency $f_d$ (for example in the form of an alternate current, AC) is superimposed to the bias signal (process step 803). The target value of the desired laser output power is inserted as input. The value of the output power can be selected in an interval defined according to the specifications of the WDM optical system in which the external cavity laser operates as a transmitter. For instance, the target output power can be chosen within the interval 5-20 dBm. Staring from the input value of the target power, the control algorithm calculates the target value of the current for the photodiode, $I_{PD}$, that monitors the output power of the cavity based on conversion factors stored in a look-up table. Then, based on the threshold and slope values of the laser diode (gain medium) response curve, stored in the look-up table, the algorithm determines the value of the gain current, $I_G$, correspondent to the target photodiode current (step 804). A feedback loop can be implemented in this step of the process between the measured photodiode current and the gain current so that the output power value remains close to the target value, this to avoid that the output power, also downstream the control on the AM amplitude, does not depart out of a certain interval (e.g. ±0.2 dB) from the target value. Since the output optical signal exhibits an amplitude modulation, the power target value is typically monitored detecting the average power value, averaging the maximum and minimum power oscillating values.

As a subsequent step (step 805), the value of the supply voltage applied to the tunable mirror, $V_{TM}$, is established, corresponding to the frequency of the selected (initial) channel. The control algorithm can foresee a loop that regulates the voltage applied to the tunable filter so as to maintain the tunable mirror at the channel frequency searching for the closest maximum of the photodiode current (thus the closest output power maximum). Naturally, in a different embodiment, the parameter that tunes the frequency filtered by the tunable filter can be different (for instance the temperature), also depending on the type of tunable filter used.

At the step 806 the modulation depth of the dither signal is selected to a value such as to obtain the desired laser signal line width. A 90% modulation depth is for instance, chosen to obtain a line width of the signal of about 1 GHz. An initial value, $P_{H0}$, of the phase of the cavity through an externally controllable parameter is fixed, that induces a phase variation to an infra-cavity phase element, $P_H$ (step 807). Such value can be chosen arbitrarily, since the mechanical tolerances and of aging could make unrecognizable, at the laser power up, the precise cavity length corresponding to the condition of alignment to the frequency of selected channel.

The steps 802-807 related to the insertion of the input values or to possible feedback loops for the optimization and/or the maintenance of the input values can naturally be performed in a different order.

In the following process phases, a loop algorithm is used for regulating the cavity phase so as to search and maintain the laser in an operating condition in which the laser cavity for which the AM component of the power is minimized reduced below a desired value. As discussed before, for modulations that, in a ECL, generate line widths not higher than about 2 GHz, the laser output controlled by the algorithm can be considered in a condition of "almost-alignment", thus with output power stable in time. The phase of the cavity is regulated acting on the external parameter, PH, that controls the optical length of a phase element present in the cavity and that therefore controls the optical length of the laser cavity. The fine tuning of the cavity phase can for instance be performed by regulating the power applied to a heater in contact with a thermo-controllable phase element. Clearly, the external parameter that adjusts the phase of the cavity could be different, for instance in the case the cavity phase is varied through another mechanism, like a supply voltage applied to a phase element that comprises an electro-optical material such as a liquid crystal or a polymer. Alternatively, the phase can be regulated by acting on the injection current of the gain element.

The initial value of the control parameter $P_{H0}$ is changed of a step $\Delta P_H$ so as to monitor the power values in the neighborhood of the initial value, $P_{H0} \pm \Delta P_H$ (process step 808, for instance in the case the parameter is an electric power the increase could be selected to be 0.1 mW). For instance, firstly the power is fixed to the value P+=PH0+ΔPH (process step

809). The photodiode current that corresponds to the value P+ is read (step 810) and from the reading of the current the amplitude of the AM modulation of the laser signal is calculated, AM+ (step 811). A way to obtain the amplitude of the modulation of the signal (the peak-to-peak amplitude or the percentage value of the optical AM) is that of sampling the photodiode current at close time intervals (for instance every 10 microseconds) so as to reconstruct the sinusoidal (or triangular) shape of the signal. It is noted that commercially available electronic circuits allows a very high calculation speed, therefore the reconstruction of the modulated signal requires a time compatible with the response speed of the control loop.

Subsequently, the value of $P_H$ is set at $P_-=P_{H0}-\Delta P_H$ (step 812) and the photodiode current corresponding to the value $P_-$ is similarly read (step 813) and the amplitude AM_ of the modulated component is calculated (step 814). At step 815, the values AM+ and AM_ calculated in the steps 811 and 814 are compared. If AM+>AM_, at the step 818 the new value of PH is set to P_, the algorithm closes the loop at the point 816 and from this new initial value the new values of P+ and P_ are calculated. If instead AM+<AM_, the new value of PH is set to P+ (step 817) and the algorithm returns to the initial point 816 of the loop calculating the values of P+ and P_ starting from the new value $P_H$. Repeating the procedure, the algorithm reaches a point of minimum for the AM within an interval defined by the step of variation of $P_H$, i.e. $\Delta P_H$.

In a different example, the step of variation could be selected in a way variable at each iteration of the feedback loop, for instance it could decrease in case the difference between the values P+ and P_ is below a certain predetermined value.

The algorithm loops described in connection with the process phases 804 and 805 can be performed in parallel and independently from the control loop for the reduction of the AM component in the laser output signal.

Figure 9:
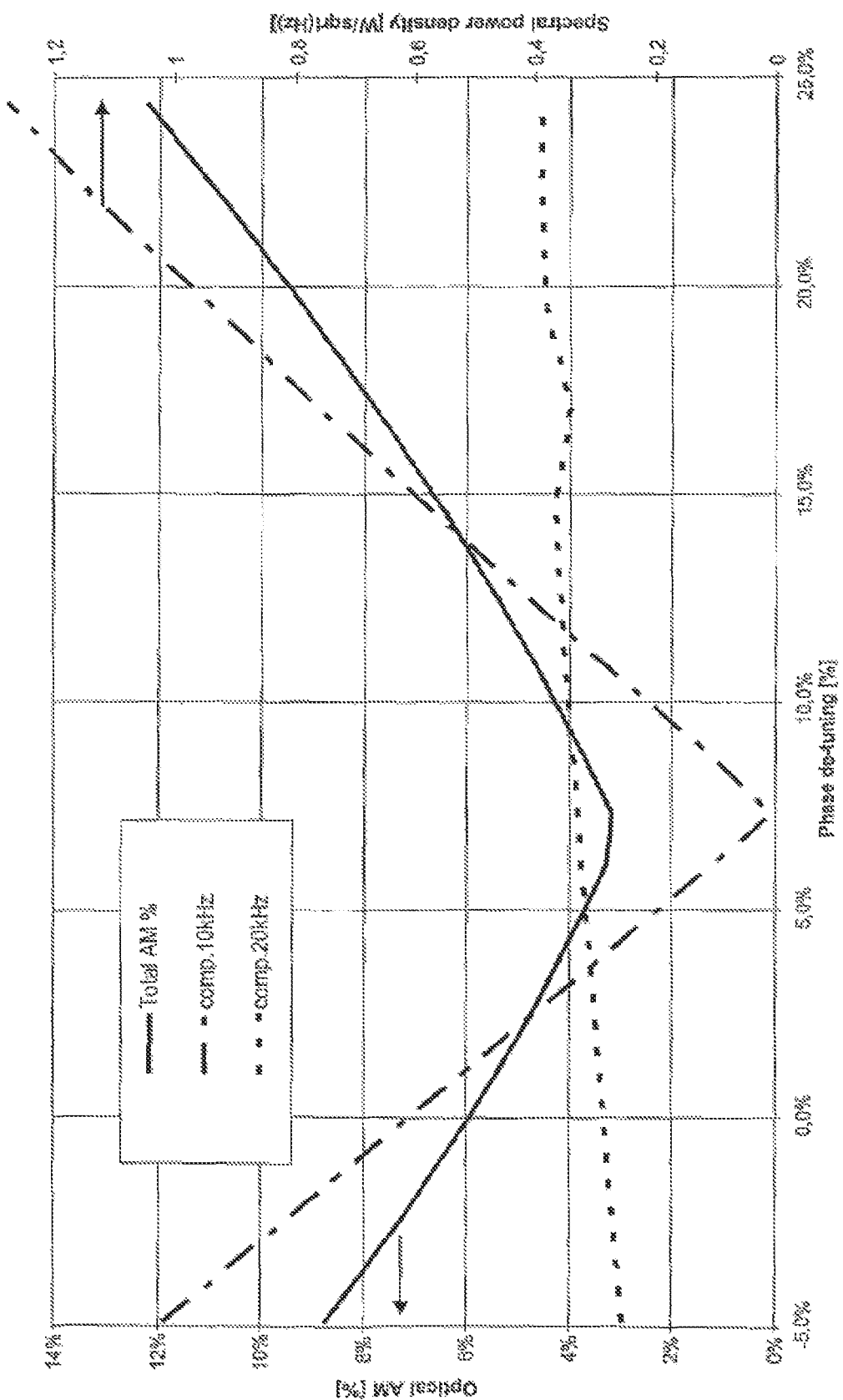
FIG. 9 reports the percentage value of the AM modulation of the optical power of FIG. 7 as a function of the de-tuning of the phase of the laser cavity and the corresponding power of the spectral density of the contributions to the modulation of the first and second harmonics.

The Applicant has observed that it is possible to perform a harmonic analysis of the modulation of the optical amplitude at the electric modulation frequency $f_d$, decomposing the contribution to the frequency modulation $f_d$ from those at higher harmonics, $2f_d$, $3f_d$, etc. FIG. 9 reports the percentage value of the AM modulation of the output optical power shown in FIG. 7 as a function of the cavity phase mismatch (continuous line, right-hand ordinate). The diagram also shows the power of the spectral density of the contributions of the modulation at $f_d$ (first harmonic) in the example equal to 10 KHz (dash-and-dot line) and at $2f_d$=20 kHz (second harmonic, dashed line). The components generated by harmonics higher than the second one generally gives a contribution to the AM amplitude that is negligible for the present purposes. It is noted that the dominant component in the generation of a minimum in the AM amplitude is the component at the frequency $f_d$, while the component due to the higher-order harmonic does not exhibits a significant minimum. It is also observed that the minimum of the spectral component at $f_d$ is very pronounced with a difference between the minimum value and the maximum value of the curve greater compared to the difference in the case of the overall AM amplitude. The applicant has therefore realized that it is possible to perform a control method for the reduction of the AM modulation in a signal modulated with frequency $f_d$ by analyzing the value of the component of the first harmonic of the AM modulation amplitude.

The measure of the only component at the frequency $f_d$ can be for instance realized through an electrical filter placed downstream of the photodiode that resonates at said frequency. An alternative method can be for instance realized with numerical filters starting from the samples of the signal generated by the photodiode.

Figure 10:
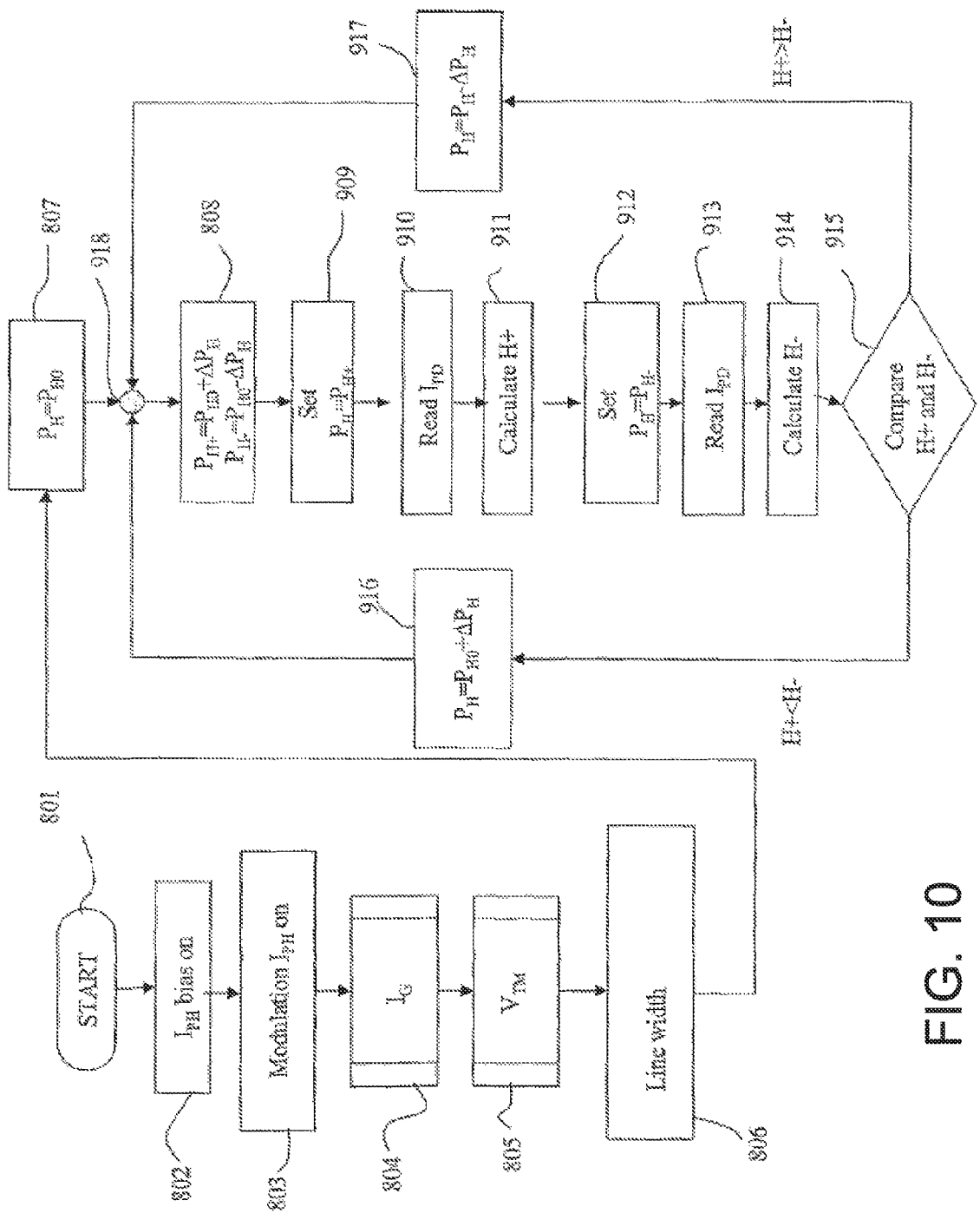
FIG. 10 illustrates a process flowchart that represents a laser control method.

FIG. 10 illustrate a flowchart 900 that represents a tunable laser control method according to a preferred embodiment of the present invention that comprises the discrimination of the frequency corresponding to the first harmonic of the electric signal modulating the phase section as parameter for the optimization of the AM component of the laser output signal. The same reference numerals are given to the process phases corresponding to those shown in FIG. 8, and their detailed description is here omitted.

Once selected a value for the step $\Delta P_H$ with which the initial value of the phase control parameter, $P_{H0}$, is made to vary (step 808), such parameter is set to the value P+ (step 909) and the photodiode current is read (step 910). From the photodiode current the component H+ of the first harmonic (at $f_d$) is extracted, for instance with the electrical filter mentioned above. At the following step (912), the value $P_H$ is set to the value P_ and the corresponding photodiode current is again read (step 913) and from this the component of the first harmonic, H_, is calculated (step 914). The two values H+ and H_ are compared at the step 915. If H+>H_, the new value of PH is set to P_ (step 917), vice versa if H+<H_, the new value of $P_H$ is set to P+ (process step 916). At the process step 918 the loop is closed and new values of P+ and P_ are calculated from the current value of $P_H$. Reiterating the procedure, the algorithm leads to the working point of the laser in a minimum of the first harmonic of the electric signal with a tolerance defined by the minimum step $\Delta P_H$.

With reference to both FIG. 8 and FIG. 10, naturally the sequence of steps 809-811 (steps 909-911) can be exchanged with the sequence of steps 811-813 (steps 912-914).

Figure 11:
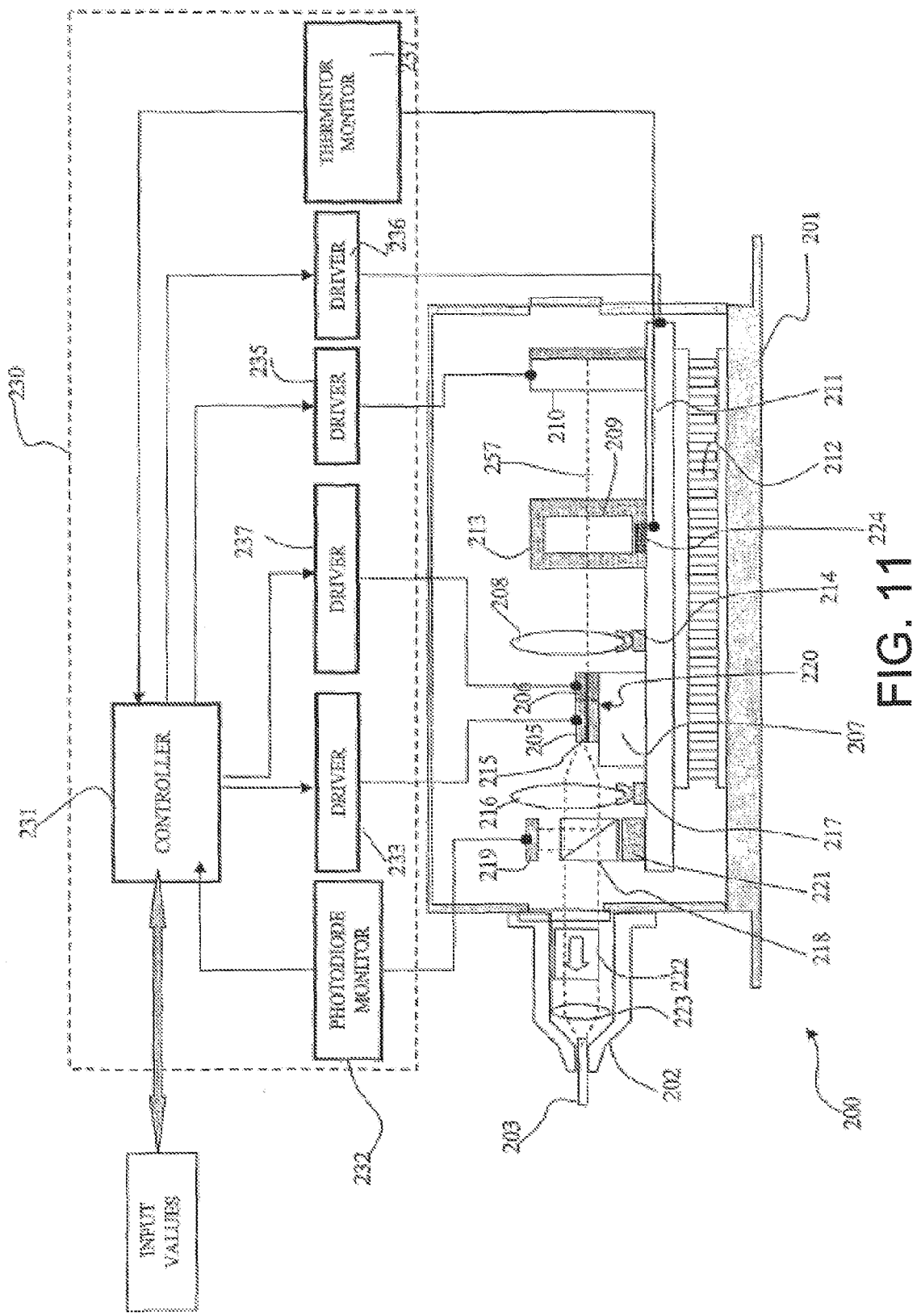
FIG. 11 is a schematic diagram (not in scale) of a laser apparatus.

FIG. 11 is a schematic diagram of a laser apparatus in which the fine tuning of the length of the cavity optical path is achieved through small variations of the gain current, $I_G$, and the modulation of the length of the optical path (caused by the dither signal that induces a modulation in frequency of the output signal) is achieved through the application of a dither signal to a phase section optically coupled to the gain medium.

Particularly, FIG. 11 includes a schematic lateral sight (not in scale) of a laser apparatus 200 that includes a laser system contained in a package, for instance a package of the "butterfly" type, that defines a seat 201. The package includes an optical collimator 202 for the coupling of the device with an optical fiber 203, for instance a standard single mode way SMF fiber. A glass window 204 tightly closes the laser system with respect to the collimator 202. The laser cavity includes an SOA 220 comprising a gain section 205 integrated into a phase section 206, a collimating lens 208, an FP filter 209 and an tunable mirror 210. The dashed line 257 represents the cavity optical axis along which the optical components of the cavity are arranged. The laser cavity is arranged on a platform 211, that also acts as a reference base for the optical elements. The use of a common platform is preferred because it minimizes the design complexity and simplifies the alignment among the components of the tunable laser. Nevertheless, also a configuration in which the elements are arranged on two (or more) different platforms could be contemplated.

The platform 211 is made of a thermally conductive material such as aluminum nitride (AlN), silica carbide (SiC), or copper-tungsten (CuW). The platform is arranged on a thermo-electric refrigerator 212 (TEC) for the thermal stabilization of the laser cavity. For instance, the platform is glued or soldered on the upper surface of the TEC 212, that can for instance be a Peltier cell.

The control of the temperature of the platform 211 is achieved by a thermal sensor device 224, like a thermistor, that is placed on the platform 211.

With the purpose of stabilizing its temperature during the operation, the etalon 209 is preferably contained in a thermally conductive housing 213 so as to promote the thermal contact between the etalon and the thermally stabilized platform 211.

The SOA 220 is preferably arranged on a submount 207, preferably thermally conductive, so as to position the SOA at a suitable height compared to the optical beam and to further improve the thermal dissipation. The submount 207 can for instance be made of silica carbide. The collimating lens 208 can be mounted on an assembly arrangement 214.

Although not shown in FIG. 11, for the sake of clarity, the tunable mirror 210 can be attached to the platform by means of a support structure. In some implementations, the tunable mirror can be horizontally supported onto the platform 211, according to what described for example in the patent application WO 2006/002663. In that case, the laser cavity includes a deflector to deflect the optical beam onto the tunable mirror.

The optical beam is coupled out of the external cavity by the front facet 215 of the gain section 205. In some implementations, a collimating lens 216 is arranged along the optical path of the output optical beam. A beam separator 218, for instance a 98%/2% tap, placed after the collimating lens 216 compared to the emitted beam, spills a small portion of the optical beam as test beam, that is directed onto a photodiode 219 for the monitoring of the output power.

The platform 211 can extend along the main direction of the optical path of the beam in such a way that the external collimating lens 216 and the beam separator 218 are mounted thereto, through of the assembly arrangement 217 and 221, respectively, schematized in the drawings.

The optical beam that emerges from the seat 201 is focused onto the fiber 203 from a focusing lens 223 after passing through an insulator 222. The lens 223 and the insulator 222 can be contained in the collimator 202. The insulator is in general an optional element that serves to prevent the beam from being back-reflected and re-entering in the cavity.

FIG. 11 schematically shows a set-up of a control circuit 230 that implements a control method of the phase of the laser cavity of the laser module 200. Such control circuit can for instance be contained in an electronic card electronically connected to the package, for instance through the external pins of a butterfly-type package.

The external input data, like for instance the target output power of the laser signal and the value of the supply voltage applied to the tunable filter corresponding to the frequency of the (initially) selected channel, are inserted into a controller 231. The controller 231 can be a conventional logic programmable processor adapted to receive and send control signals to the components of the ECL. The laser output signal power is calculated in the controller 231 from the current of the photodiode 219 by picking up the data through a monitor of the photodiode 232, for instance a signal conditioning circuit. To this purpose, the controller 231 contains a function that links the two physical values, laser signal power and photodiode current.

The gain section 205 and the phase section 206 are fed through the driver modules 233 and 237, respectively. The driver module 233 contains circuits for the control of the injection current, $I_G$, that is driven by the controller 231. Likewise, the driver module 237 includes circuits for the control of the supply current of the phase section, $I_{ph}$, and of the current modulation (dither) superimposed thereon. To this purpose, the control circuit can include an oscillator (not shown) that generates a periodic signal and that is connected to the driver module 237. The controller 231 sets the values of continuous and alternate current for the operation of the SOA 220 through the drivers 233 and 237 and controls the operation thereof through the electrical signals sent by the drivers themselves.

A driver module 235 feeds the tunable mirror, in this example an electro-optical element, with an alternate voltage at a certain value in absolute value corresponding to the frequency of the lasering channel. Such a voltage is driven by the controller 231 that comprises a look-up table where the voltage values corresponding to the frequencies of the channels in the frequency interval of interest are stored.

The ECL of FIG. 11 is thermally stabilized through the TEC 212 and the temperature of the platform 211, thermally coupled to the TEC, on which the optical elements of the laser cavity are arranged, is detected by the thermistor monitor module 237 through the temperature sensor 224 that sends suitable signals to the controller 231. The TEC 212 is fed through the driver module 236, also driven by the controller 231.

For instance, the thermistor monitor 237 is a signal conditioning circuit that measures the resistance introduced by the thermistor converting such value into digital signals intended for the controller 231. The latter controls that the temperature of the platform is maintained substantially constant, for instance it fluctuates around a value, e.g., 30° C.±0.1° C. or 25° C.±0.2° C. Such temperature value, in addition to satisfy the thermal dissipation requirement of the gain medium, advantageously keeps the transmission peaks of the etalon 209 aligned with frequencies of the transmission grid defined by the ITU standard.

Figure 12:
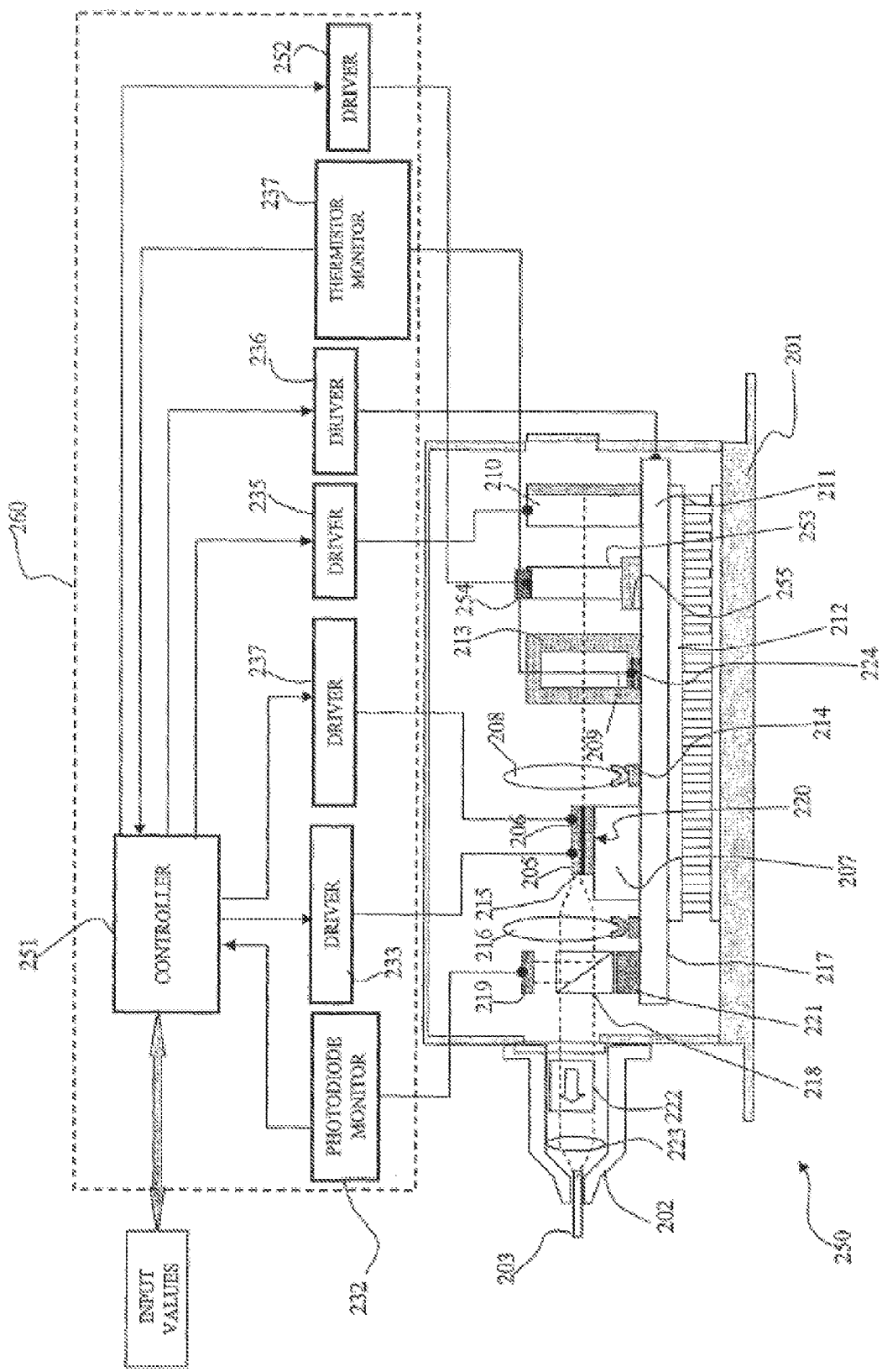
FIG. 12 is a schematic diagram (not in scale) of a laser apparatus.

FIG. 12 is a schematic diagram of a laser apparatus according to an embodiment of the invention in which the length of the optical path is adjusted with variations of the phase of an infra-cavity phase element different from the phase element to which the dither is applied, said variations being achieved by acting on a control parameter, like the temperature, an electric stimulus or a mechanical deformation applied through MEMS or piezo-electric devices. Particularly, in the example of FIG. 12 the phase element is a thermo-controllable element substantially optically transparent to the laser beam that passes therethrough.

A set-up of a control circuit 260 implements a control method of the phase of the laser cavity of a laser module 250. The same reference numerals of FIG. 11 are assigned to the elements of the ECL module corresponding to those shown in FIG. 11. Particularly, the controller 251 (for instance a conventional processor) controls and drives the modules 232, 233, 235-237 in way similar to that described in connection with FIG. 11.

The laser cavity of the laser module 250 includes a thermocontrollable phase element 253 placed on a submount 255 that is arranged on the platform 211. The thermal resistance of the path of the heat flow from the submount 255 and the platform 211 is preferably selected in such a way as to thermally decouple at least partially the phase element from the platform and thus from the TEC, so as to increase the efficiency of the heating applied to the element.

The heating efficiency is in relationship with the thermal resistance of the support added to that of the phase element. In some implementations, the thermal resistance of the support and phase element arrangement is comprised between 80 and 180 K/W or between 100 and 160 K/W. The thermal resistance of the submount 255 depends on the thickness of the submount and on the material. The submount can for instance be made of Kovar®. In some implementations, the phase element has a thermal resistance comprised between 3 and 8 K/W.

The thermal control of the element 253 is achieved by placing a heater element 254 in thermal contact with the element itself. The heater element can be for instance a resistive element, such as an SMD resistor. A current is fed to the resistor through the resistor driver 252, and such a current generates a dissipated power through the resistor that depends on the electric resistance of the heater element. By Joule effect, a heat is thus produced, increasing the temperature of the resistor. The temperature of the phase element in thermal contact with the resistor results to be proportional to the current that flows through the resistor. The controller 251, that stores the relationship between current and phase, receives the signal of the current fed to the resistor and, through the control algorithm, it sends the control signals to the resistor driver so as to regulate the phase thereof and thus the length of the cavity optical path.

In some implementations, the reduction of the AM component of the output power is achieved acting on the gain of the gain medium of the ECL in such a way as that the variation of transmissivity caused by the dither modulation applied to a phase element is at least partially compensated by a corresponding variation of the gain current of the gain medium, so as to reduce or minimize the variation of the loop gain (roundtrip gain) of the laser cavity.

Referring to FIG. 5, a dither modulation at a certain frequency $f_d$ (waveform 150) causes the transmissivity of the phase element to periodically oscillate between a minimum value and a maximum value (waveform 151). In the case of a transfer function of the phase element that decreases when the phase current increases as in FIG. 5, in correspondence of a greater current on the phase element compared to the bias, $I_{ph}$, i.e. in correspondence of the positive half-wave of the modulation signal, the transmissivity decreases, while in correspondence of the negative modulation half-wave the transmissivity increases, always compared to a transmissivity average value set by the continuous component of the phase current.

The Applicant has found that if a modulation signal is applied to the gain current of the gain medium having the same modulation frequency as the dither signal, it is possible to compensate at least partially the transmissivity modulation induced in the phase element by the dither, and thus to reduce or to minimize the AM modulation of the laser output signal.

Figure 13:
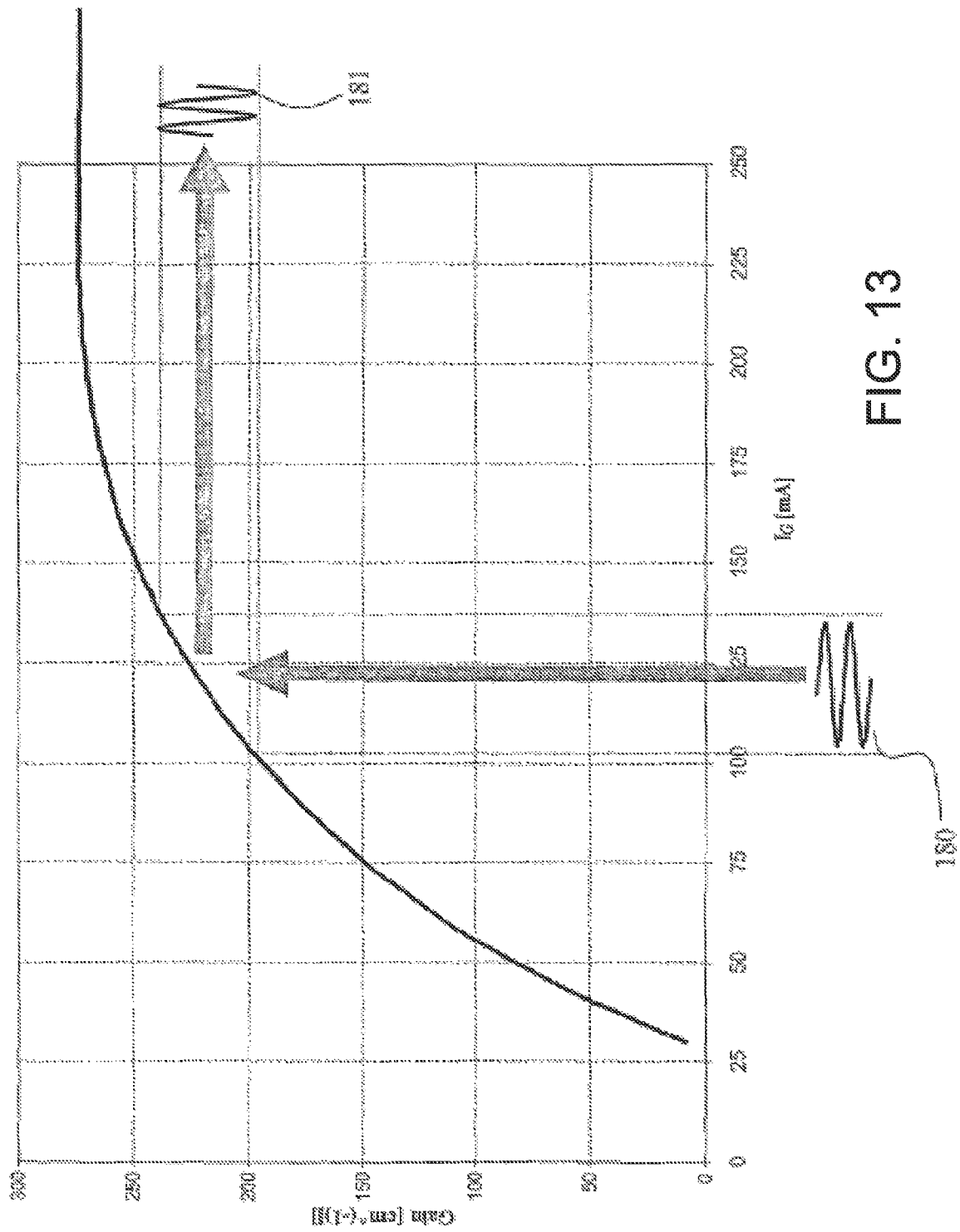
FIG. 13 reports the gain of a semiconductor laser diode as a function of the gain current supplied to the medium itself.

FIG. 13 reports the gain of a semiconductor laser diode that can be used as gain medium in the ECL, as a function of the injection current $I_G$ fed to the medium itself. The gain increases in non-linear way as the injection current increases. A current modulation applied to the gain medium, indicated schematically in the drawings with the waveform 180, causes a modulation of the gain itself indicated with the waveform 181. A modulation of the gain of the laser diode causes in turn a modulation of the length of the cavity optical path.

The Applicant has realized that, in the case of a phase element with transfer function that decreases as the control parameter increases (at least within the transmissivity excursion caused by the modulation), in correspondence of a greater current on the phase element compared to the bias (positive half-wave) it is necessary to increase the current on the gain element. In correspondence of a small current on the phase element compared to the bias (negative half-wave) it is necessary to decrease the current on the gain element. In other words, if the value of IG is selected in such a way that within the optical frequency excursion of the laser signal the gain grows with the current, the loss in transmissivity of the phase element corresponding to the positive half-wave can be compensated at least partially by an increase of the cavity gain, while the increase of transmissivity in the time interval corresponding to the negative half-wave can be compensated by a reduction of the gain.

As described in foregoing, the modulation of the length of the optical path generated by the modulation of the gain current can be exploited for generating a widening of the spectral line, even if at the cost of high modulations of the optical AM, especially when large widening of the spectral line are required. In some implementations, the frequency widening of the output laser line is achieved by applying a dither signal at frequency $f_d$ to a phase element, wherein such signal has a modulation depth selected so as to achieve the desired line width. A modulation of the gain of the gain medium is applied simultaneously to the dither modulation with the purpose of at least partially compensating the variation in the cavity transmissivity caused by the phase element.

In some implementations, the bias current of the phase current is selected in such a way that in correspondence of the excursion in phase current that generates the dither modulation, the transmissivity decreases as the current increases. An electric modulation signal is applied to the gain medium of the dither signal at the same electric frequency $f_d$, and preferably substantially with the same phase. The gain bias current (continuous component, IG) is selected in such a way that in correspondence of the excursion in the phase current that generates the gain modulation, the gain itself increases with the increase in current. An ECL configuration that implements the present embodiment can be described in connection with FIGS. 11 and 12 in which the control circuit includes an oscillator (not shown) that generates an oscillating signal at the frequency $f_d$ that is fed both to the driver module 233 and to the driver module 237 so as to create a modulation on the phase section and a "counter-modulation" on the gain section. In some examples, the modulation signal of the gain medium has the same phase as the modulation signal of the phase element. In other words, the zeros of the dither signal substantially correspond to the zeros of the gain modulation signal. Nevertheless, small departures between the phases, for instance not higher than about $\mu/10$, of the two electrical modulating signals can be tolerated.

Figure 14:
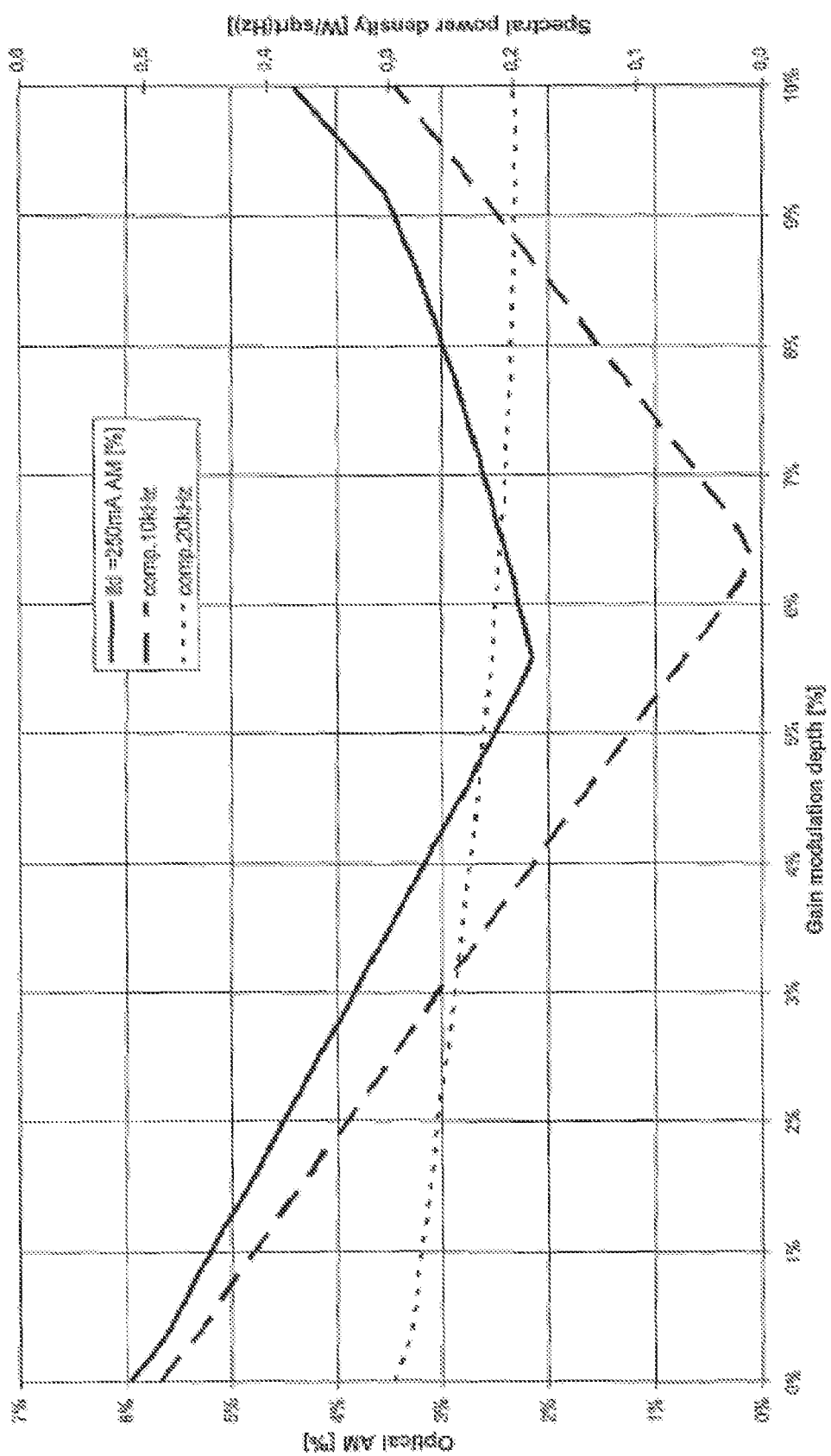
FIG. 14 reports results of numerical simulations in which the percentage value of the AM modulation of the output optical power (continuous line) is calculated as a function operation of the percentage value of the modulation depth of the modulation signal applied to the gain medium. There is also reported the power of the spectral density of the contributions of the modulation of the first and second harmonics of the percentage value of the optical AM.

FIG. 14 reports results of numerical simulations in which the percentage value of the AM modulation of the output optical power (continuous line, right-hand ordinate) is calculated as a function of the percentage value of the gain modulation depth, defined as the relationship between the gain signal modulated component's peak-to-peak amplitude and the value of the continuous component thereof, $I_G$. In the simulations, an ECL has been considered with a phase section having a transmissivity of the type represented in FIG. 5 and with a gain medium having a gain function of the type represented in FIG. 13. In the simulations, the gain bias current, $I_G$, is equal to 250 mA, to which a gain modulation signal is applied at electrical frequency $f_d$=10 kHz equal to that of the dither signal applied to a phase section with transmissivity behavior analogous to that reported in FIG. 7. The dither modulation has a modulation depth such as to generate a line width of 1.2 GHz (for instance equal to about 90%).

In FIG. 14 there are also reported the spectral power densities (left-hand ordinate) of the modulation contributions at $f_d$ equal to 10 kHz (first harmonic, dashed line) and at $2f_d$=20 kHz (second harmonic, dotted line). The figure shows that an interval of gain modulation depth values exists inside which the AM amplitude of the output signal exhibits a minimum value. In the example of FIG. 14 the interval of values of gain modulation depth that allow a significant reduction of the AM amplitude of the laser output signal extends from about 4.5% to 7%.

The minimum of the first harmonic of the AM component may not correspond to the same gain modulation depth value that provides the minimum value of the total AM amplitude. This is probably due to the non-perfect complementarity of the transmission profile of the phase element and of the gain profile.

In the description in connection with FIGS. 5 and 13, an ECL has been considered that includes, in addition to a gain medium, a phase element with transmissivity that decreases with the increase of a control parameter on which the dither modulation is applied. An ECL in which a phase element is included that exhibits a transmissivity that varies as the control parameter varies, at least in the variation interval caused by the modulation signal, and that, still within such interval, has a positive first derivative, for example it increases with the increase in the control parameter. The gain medium can exhibit a gain curve similar to that described in connection with FIG. 13, i.e. the gain increases with the increase in the gain current $I_G$. Thus, the first derivative of the gain of the gain medium and the transmissivity of the phase element, at least in the interval of the excursions corresponding to the dither modulation, have the same sign.

The Applicant has realized that it is possible to at least partially compensate the transmissivity modulation induced in the phase element by the dither (in this case having first derivative with the same sign as the first derivative of the corresponding gain variation), and thus to reduce or minimize the AM modulation of the laser output signal, if a modulation signal is applied to the gain medium having the same frequency $f_d$ as the dither signal but substantially in phase opposition of $\pi$ with respect to the dither signal. In this way, if the value of $I_G$ is selected in such way that within the excursion of optical frequency of the laser signal the gain grows with the current, the increase in transmissivity of the phase element corresponding to the positive half-wave can be compensated by a decrease of the cavity gain due to the negative half-wave of the signal in phase opposition compared to the dither signal, while the reduction of transmissivity in the time interval corresponding to the negative half-wave can be compensated by an increase of the gain (positive half-wave). In some implementations, the two modulation signals are in phase opposition, i.e. they have a phase difference of $\pi$. Nevertheless, small deviations of the $\pi$ difference with respect to the phases of the two electrical modulating signals can be tolerated, for instance not higher than about $\pi/10$.

An implemented ECL configuration can be described with reference to FIGS. 11 and 12, in which the control circuit includes an oscillator (not shown) that generates an oscillating signal at frequency $f_d$ and with a certain phase. The oscillator feeds the oscillating signal both to the driver module 233 and to the driver module 237. The driver module 233 of the gain medium can include an inverting amplifier to obtain the phase inversion of the $\pi$ phase mismatch of the oscillating signal.

Making reference to the relationship (3) described above, a variation of the cavity transmissivity, $\alpha$, due to the variation of the transmissivity of the cavity phase element that is subject to the modulation, can be compensated, at least partially, by a variation of the gain of the gain medium such that the product of the left side of the relationship (3) remains as unchanged as possible.

As described in the foregoing, the modulation of the length of the optical path caused by the modulation of the gain current can be exploited for generating a widening of the spectral line, even if at the price of high modulations of the optical AM, especially when substantial widenings of spectral line are required. In the case described with reference to the application of a gain modulation to the gain medium in order to reduce the AM amplitude induced by the dither modulation on a phase element different from the gain element, the modulation necessary for a reduction or minimization of the AM amplitude generally is significantly lower in amplitude compared to the dither modulation. In some implementations, the percentage value of the modulation depth of the gain signal is lower than the percentage value of the modulation depth of the dither signal of at least a factor of five, more preferably of at least a factor of eight. Under these conditions, the line widening induced by the gain modulation is generally much smaller compared to that induced by the phase element. Nevertheless, it is possible to implement a control on the spectrum widening to compensate possible variations of the line width with respect to the desired value, for instance in such a way so to maintain the line width nearly constant at 1 GHz±0.1 GHz.

In some implementations, the percentage value of the modulation depth of the electric modulation signal of the phase element varies from 50% to 90%, more preferably from 70% to 90%.

Advantageously, in the case of a tunable ECL apparatus comprising a grid generating filter and a tunable filter, the laser works in condition of alignment, i.e. the frequency of a cavity mode is centered under the peak of the grid generating filter selected by the tunable filter. Such condition can be achieved through a control algorithm that looks for the maximum of the (average) power of the laser output signal.

Figure 15:
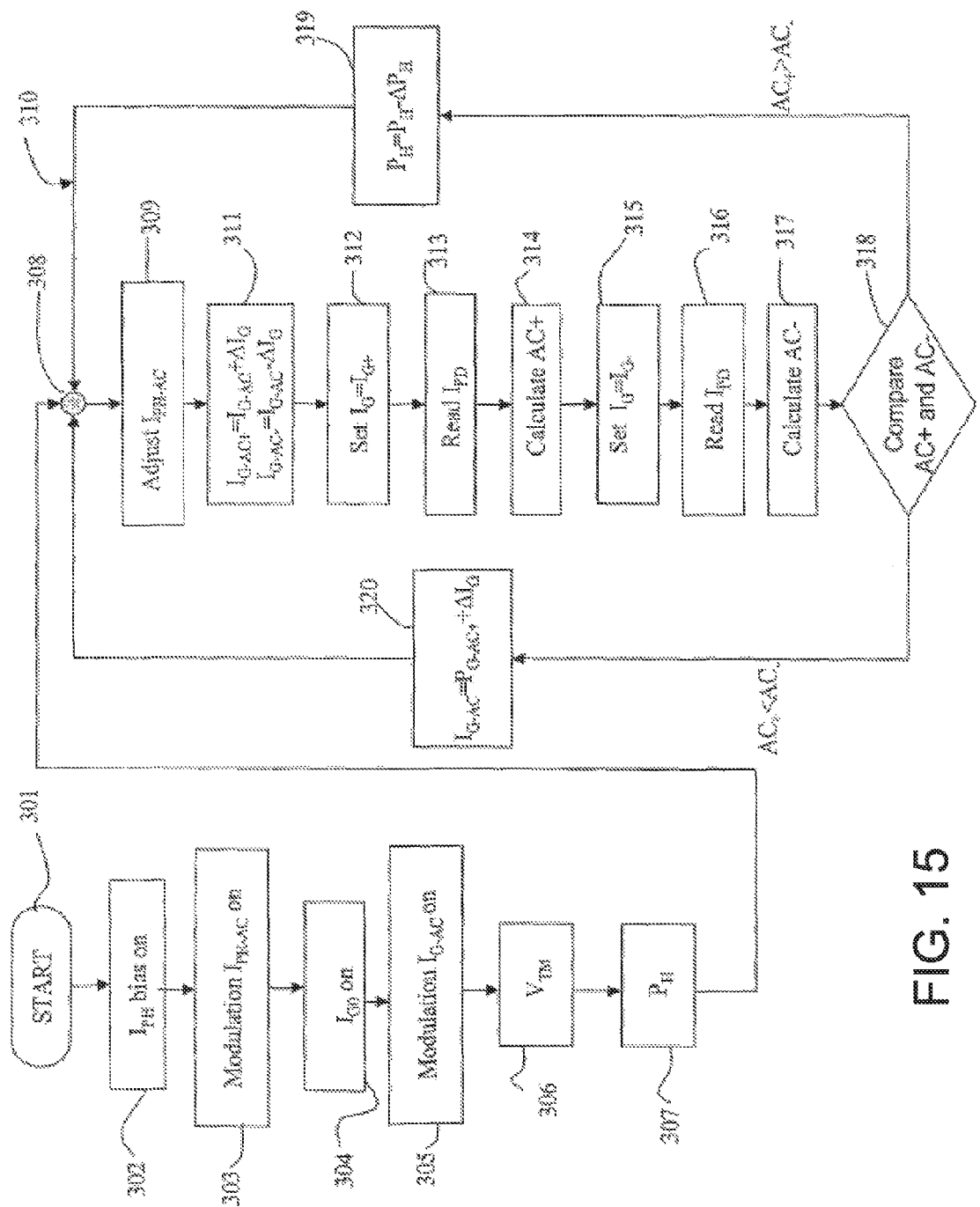
FIG. 15 illustrates a process flowchart that represents a laser control method.

FIG. 15 illustrates a process flowchart 300 that represents a laser control method according to a preferred embodiment of the present invention. The method can be implemented in a control algorithm that uses a loop to keep the phase in the condition that corresponds to the minimization or to a reduction of the modulated component of the output power. The method can for instance be implemented in a laser apparatus described in connection with FIGS. 11 and 12.

At the process step 301, the laser is turned on. The value of the bias of the dither signal that generates a phase current, $I_{ph}$, applied to a phase element is inputted into the algorithm as an input value (step 302). A frequency modulation signal is then turned on, for instance a sinusoidal signal superimposed onto the bias signal of the phase current with peak-to-peak amplitude $I_{ph-AC}$ (process step 303), at a dither frequency $f_d$. The modulation depth of the dither signal is selected at such a value as to obtain the desired line width of the laser signal. A modulation depth of 80% is for instance chosen to obtain a signal line width of about 1 GHz.

The algorithm determines the bias value of the gain current, $I_{G0}$, that corresponds to a target current, $I_{PD}$, (step 304) of the photodiode that monitors the cavity output power. Such a value is associated with a target value of the laser output power. At step 305, a gain modulation signal is turned on with peak-to-peak amplitude $I_{G-AC}$, such signal being applied to the gain medium with modulation frequency equal to $f_d$. The algorithm can obviously include the percentage values of the amplitudes of the modulation depth instead of the peak-to-peak amplitudes. In general, reference will be made to the amplitude of the modulation signal that can indicate either one of the quantities.

As a next step (step 306), the value of the supply voltage applied to the tunable mirror, $V_{TM}$, is set, corresponding to the frequency of the (initially) selected channel. The control algorithm can foresee a loop that regulates the voltage applied to the tunable filter so as to maintain the mirror tuned at the channel frequency, looking for the maximum closest to the photodiode current (thus, the maximum closest to the output power). Naturally, in a different embodiment, the parameter that tunes the frequency filtered by the tunable filter can be different (for instance the temperature), also in dependence of the type of tunable filter that is used.

At step 307, the phase of the cavity is optimized through an externally controllable parameter that induces a phase variation on an infra-cavity phase element, $P_H$, maximizing the photodiode current, $I_{PD}$, therefore positioning the cavity on the condition of alignment between the channel frequency and the laser output frequency. The algorithm can foresee at the step 307 a feedback loop that regulates the parameter $P_H$ applied to a phase element or to the gain medium that looks for the maximum of the photodiode current. In an ECL configuration that includes an FP filter this condition corresponds to the condition of alignment of the mode cavity under the peak of the FP filter selected by the tunable filter.

The steps 302-307 related to the insertion of the input values or to possible feedback loops for the optimization or the keeping of the input values can naturally be performed in a different order.

In the following process phases, a loop algorithm is used for regulating the phase of the cavity so as to look for and to keep the laser in an operating condition in which the laser cavity for which the AM component of the power is minimized or is kept below a desired value.

At the process step 309, the value of the modulated component $I_{ph-AC}$ of the phase current is regulated so as to keep the line width of the output signal at the target value selected at step 303.

The initial value $I_{G-AC}$ of the peak-to-peak amplitude of the modulated component of the gain current selected at the process step 305 is varied of a step $\Delta I_{G-AC}$ so as to monitor the values of modulated current in the neighborhood of the initial value, $I_{G-AC} \pm \Delta I_{G-AC}$ (process step 311, for instance the increase could be selected to be 0.1 mA). For example, firstly the amplitude $I_{G-AC}$ is set to the value $I+=I_{G-AC}+\Delta I_{G-AC}$ (process step 312). The photodiode current that corresponds to the value $I_{G+}$ is read (step 313) and from the current reading the amplitude of the AM modulation of the laser signal $AC_+$ is calculated (step 314). A way to derive the amplitude of the modulation of the laser output signal is to sample the photodiode current at close time intervals (for instance every 10 microseconds) so as to reconstruct the sinusoidal (or triangular) shape of the signal.

Subsequently, the value of $I_{G-AC}$ is set to $I_-=I_{G-AC}-\Delta I_{G-AC}$ (step 315) and the photodiode current corresponding to said value is similarly read (step 316), subsequently calculating the amplitude of the modulated component $AC-$ (step 317). At the step 815, the values $AC_+$ and $AC_-$ calculated at the steps 314 and 317 are compared. If $AC_+>AC_-$, at the step 319 the new value of IG is set to L and the algorithm closes the loop at the step 308, then at the step 311 it calculates new values of $I_+$ and $I_-$. If instead $AC_+<AC_-$, the new value of $I_{G-AC}$ is set to $I_+$ (step 320) and the algorithm returns to the starting point 308 of the loop, calculating the values of $I_+$ and $I_-$ starting from the new value $I_{G-AC}$. Repeating the procedure, the algorithm comes to a point of minimum of the amplitude AM of the laser output signal in a neighborhood defined by the variation step of the amplitude of the modulation of the gain current $\Delta I_{G-AC}$.

In a different embodiment, the variation step $\Delta I_{G-AC}$ could be selected in variable way at each iteration of the feedback loop, for instance it could decrease in case the difference between the values $AC_+$ and $AC_-$ are both below a certain predetermined value.

A variation of the amplitude of the modulation of the gain current causes a variation in the laser line width and thus at the step 309 the algorithm performs a control on the line width, adjusting, if necessary, the width so as to bring it to the desired target value. It is noted that although both the phase modulation and the gain modulation affect the line width, the main contribution is typically given by the modulation induced by the current applied to the phase element, especially if the desired output signal line width to be obtained is higher than 0.5-0.8 GHz. In some implementations, the percentage value of the gain modulation depth applied to the gain medium is not higher than ⅕ compared to the percentage value of the modulation depth of the phase element. In some examples, the percentage value of the gain modulation depth is not higher than ⅛ compared to the percentage value of the modulation depth of the phase element.

The algorithm loops described with reference to the process phases 306 and 307 can be performed in parallel and independently from the control loop 310 for the reduction of the AM component in the laser output signal.

With reference to FIG. 14, it is possible to perform a harmonic analysis of the modulation of the optical amplitude at the electrical modulation frequency $f_d$ by decomposing the contribution at the modulation frequency $f_d$ from the higher harmonics, $2f_d$, $3f_d$, etc.

In some implementations, it is possible to implement a control algorithm that comprises the discrimination of the frequency corresponding to the first harmonic of the electrical signal modulating the phase section as a parameter for the optimization of the AM component of the laser output signal. In this case, from the reading of the photodiode current at the steps 313 and 316, the component of the first harmonic (at $f_d$) of the AM amplitude is calculated instead of the total amplitude at the steps 314 and 317, respectively. The components of the first harmonic of the AM amplitude are then compared similarly to what done at the step 318, looking for the values that minimize the AM component at $f_d$.

A number of implementations have been described. Nevertheless, it will be understood that various modifications may be made without departing from the spirit and scope of the disclosure. Accordingly, other implementations are within the scope of the following claims.

What is claimed is:
1. A method of operating a laser that emits an output optical signal at a central laser frequency and that comprises an external cavity including a semiconductor gain medium and a phase element whose phase is controllable through a control parameter, the method comprising:
applying a first electrical modulation signal to the control parameter so as to create a modulation of a length of a cavity optical path at a modulation frequency and with a first modulation depth that causes an optical frequency excursion and an amplitude modulation of the output optical signal;
simultaneously applying a second electrical modulation signal to the gain medium at the modulation frequency and at a second modulation depth;
detecting a modulation amplitude of the output optical signal; and
adjusting the second modulation depth based on an analysis of the modulation amplitude of the laser output signal,
wherein the second modulation depth of the second modulation signal has a percentage value not higher than about ⅕ compared to a percentage value of the first modulation depth of the first modulation signal.

2. The method of claim 1, wherein the phase element has an optical transmissivity that substantially decreases with an increase in the control parameter at least within its variation induced by the first modulation signal and wherein the first modulation signal is substantially in phase with the second modulation signal.

3. The method of claim 1, wherein the phase element has an optical transmissivity that substantially increases with the increase in the control parameter at least within its variation induced by the first modulation signal and wherein the first modulation signal is substantially in phase opposition compared to the second modulation signal.

4. A method of operating a laser that emits an output optical signal at a central laser frequency and that comprises an external cavity including a semiconductor gain medium and a phase element whose phase is controllable through a control parameter, the method comprising:
applying a first electrical modulation signal to the control parameter so as to create a modulation of a length of a cavity optical path at a modulation frequency and with a first modulation depth that causes an optical frequency excursion and an amplitude modulation of the output optical signal;
simultaneously applying a second electrical modulation signal to the gain medium at the modulation frequency and at a second modulation depth;
detecting a modulation amplitude of the output optical signal; and
adjusting the second modulation depth based on an analysis of the modulation amplitude of the laser output signal,
wherein the second modulation depth of the second modulation signal has a percentage value not higher than $1/8$ compared to a percentage value of the first modulation depth of the first modulation signal.

5. The method of claim 1, wherein a percentage value of the first modulation depth is included in the range from 50% to 90%.

6. The method of claim 5, wherein the external cavity laser is a tunable laser configured to emit an output optical signal at a central channel frequency selectable within an operating frequencies interval comprising a spectrally selective filter that defines a plurality of transmission bands, substantially aligned to the operational frequencies interval, the method further comprising the steps of tuning in frequency a tunable filter by selecting in a tunable way one of the transmission bands of the spectrally selective filter, monitoring an average power values of the output optical signal and adjusting the length of the cavity optical path so as to maximize the average power of the output optical signal.

7. The method of claim 6, wherein the phase element is a phase section optically coupled to the gain medium, the phase section is arranged adjacent to the gain medium and the gain medium and the phase section belong to a semiconductor optical amplifier.

8. The method of claim 7, further comprising the step of monitoring the optical frequency excursion of the output optical signal and adjusting the first modulation depth of the first modulation signal so as to keep the optical frequency excursion at a value substantially corresponding to a predetermined value.

9. The method of claim 8, wherein the predetermined value of optical frequency excursion of the laser output signal is not lower than 0.5 Ghz.

10. A laser apparatus comprising an external cavity laser configured to emit an output optical signal at at least one central channel frequency, the cavity of the external cavity laser comprising:
a gain medium configured to emit an optical beam in cavity along an optical axis, and an optical phase element whose phase is controllable through a control parameter, the optical phase element being arranged along the cavity optical axis;
a controller comprising a first modulation generator device configured to provide a first electrical modulation signal to the optical phase element so as to create a modulation of a length of a cavity optical path at an electrical modulation frequency and with a first modulation depth that causes an optical frequency excursion and an amplitude modulation of the output optical signal;
a second modulation generator device configured to provide a second electrical modulation signal to the gain medium at the modulation frequency and with a second modulation depth, wherein the second modulation depth of the second electrical modulation signal has a percentage value not higher than about $1/5$ compared to a percentage value of the first modulation depth of the first electrical modulation signal;
a detector device configured to detect a modulation amplitude of the output optical signal; and
a regulator device configured to adjust the second modulation depth, the controller configured to communicate with the regulator device and with the detector device and configured to generate control signals to control the modulation amplitude of the output optical signal.

11. The laser apparatus of claim 10, wherein the controller is configured to generate a feedback loop to adjust the second modulation depth up to a minimization of the modulation amplitude of the output optical signal.

12. The laser apparatus of claim 10, wherein the controller is configured to generate a feedback loop to adjust the second modulation depth up to a reduction of the modulation amplitude of the output optical signal below a certain predetermined value.

13. The laser apparatus of claim 10, wherein the controller is configured to monitor the amplitude detected by the detector device and the second modulation depth, and to provide control signals to the regulator device to minimize the amplitude of the output optical signal.

14. The laser apparatus of claim 10, wherein the phase element has an optical transmissivity that substantially decreases with an increase in the control parameter at least within its variation induced by the first modulation signal and wherein the first modulation signal is substantially in phase with the second modulation signal.

15. The laser apparatus of claim 10, wherein the phase element has an optical transmissivity that substantially increases with an increase in the control parameter at least within its variation induced by the first modulation signal and wherein the first modulation signal is substantially in phase opposition compared to the second modulation signal.

\* \* \* \* \*